United States Patent [19]

Blackwell et al.

[11] Patent Number: 5,760,398

[45] Date of Patent: Jun. 2, 1998

[54] INFRARED RADIATION DETECTOR HAVING A REDUCED ACTIVE AREA

[75] Inventors: Richard Blackwell, Andover; Neal R. Butler, Acton; Jacek Mroczkowski, Lexington, all of Mass.

[73] Assignee: Lockheed Martin IR Imaging Systems, Inc., Lexington, Mass.

[21] Appl. No.: 760,240

[22] Filed: Dec. 4, 1996

Related U.S. Application Data

[60] Provisional application No. 60/007,909, Dec. 4, 1995.

[51] Int. Cl.$^6$ ...................................... H04N 5/33
[52] U.S. Cl. ............... 250/332; 250/338.4; 250/370.08
[58] Field of Search ........................... 250/332, 338.1, 250/338.4, 349, 370.01, 370.08

[56] References Cited

U.S. PATENT DOCUMENTS

| | | | |
|---|---|---|---|
| 4,651,001 | 3/1987 | Harada et al. | 250/330 |
| 4,754,139 | 6/1988 | Ennulat et al. | 250/332 |
| 4,922,116 | 5/1990 | Grinberg et al. | 250/495 |
| 5,010,251 | 4/1991 | Grinberg et al. | 250/332 |
| 5,021,663 | 6/1991 | Hornbeck | 250/349 |
| 5,113,076 | 5/1992 | Schulte | 250/370 |
| 5,171,733 | 12/1992 | Hu | 505/1 |
| 5,286,976 | 2/1994 | Cole | 250/349 |
| 5,288,649 | 2/1994 | Keenan | 437/3 |
| 5,300,915 | 4/1994 | Higashi et al. | 338/22 R |
| 5,369,280 | 11/1994 | Liddiard | 250/370 |

(List continued on next page.)

FOREIGN PATENT DOCUMENTS

| | | | |
|---|---|---|---|
| A-0 384 880 | 8/1990 | European Pat. Off. | G02B 27/00 |
| A-0 481 552 | 4/1992 | European Pat. Off. | H01L 31/02 |
| WO-A-93 09414 | 5/1993 | WIPO | G01J 5/34 |
| WO 93/26050 | 12/1993 | WIPO | G01J 5/20 |
| WO 94/01743 | 1/1994 | WIPO | G01J 5/20 |

OTHER PUBLICATIONS

N. Butler, R. Blackwell, R. Murphy, R. Silva and C. Marshall "Dual Use, Low Cost Uncooled Microbolometer Imaging system" Presented at SPIE, San Diego, CA, Jul. 12, 1995.

N. Butler, R. Blackwell, D. Abate, C. Marshall and W. Watson Advanced Microbolometer Digital Output Focal Plane Array, Lockheed Martin IR Imaging Systems, Jul. 1996.

International Search Report from International Patent Application PCT/US 96/19261, filed Apr. 12, 1996.

Patent Abstracts of Japan, vol. 10, No. 175 (E–413), Jun. 20, 1986 & JP-A-61 024272 (Nippon Denki).

*Primary Examiner*—Don Wong
*Attorney, Agent, or Firm*—Wolf, Greenfield & Sacks, P.C.

[57] ABSTRACT

A microbridge detector is with an active area that is smaller than a pixel collection area of the microbridge detector. The microbridge detector includes a semiconductor substrate on a first level and an microbridge level disposed above the semiconductor substrate. The microbridge level includes the active area having the pixel collection area greater than a square area of the active area of the microbridge detector. In addition, downwardly extending leg portions are a continuation of the microbridge level and support the microbridge level above the semiconductor substrate so that a thermal isolation gap exists between the microbridge level and the semiconductor substrate. Further, electrically conductive paths are included within the downwardly extending leg portions and connect the active area in the microbridge level to the semiconductor substrate. With this apparatus, the microbridge detector is provided with a pixel collecting area that is larger than a fill factor of the microbridge detector and thus is provided with an enhanced optical collection sensitivity. In addition, with this apparatus, the microbridge detector device can be fabricated with a smaller active area without having to build a smaller microbridge level and thus is not limited by processing techniques.

36 Claims, 16 Drawing Sheets

U.S. PATENT DOCUMENTS

| | | | |
|---|---|---|---|
| 5,399,897 | 3/1995 | Cunningham et al. | 257/467 |
| 5,401,968 | 3/1995 | Cox | 250/353 |
| 5,446,284 | 8/1995 | Butler et al. | 250/332 |
| 5,486,698 | 1/1996 | Hanson et al. | 250/332 |
| 5,512,748 | 4/1996 | Hanson | 250/332 |
| 5,534,111 | 7/1996 | Hocker et al. | 216/15 |
| 5,602,393 | 2/1997 | Gerard | 250/332 |
| 5,640,013 | 6/1997 | Ishikawa et al. | 250/332 |
| 5,647,946 | 7/1997 | Belcher et al. | 156/345 |
| 5,654,580 | 8/1997 | Beratan et al. | 257/467 |
| 5,656,848 | 8/1997 | Beratan et al. | 257/446 |
| 5,672,903 | 9/1997 | Butler et al. | 257/467 |

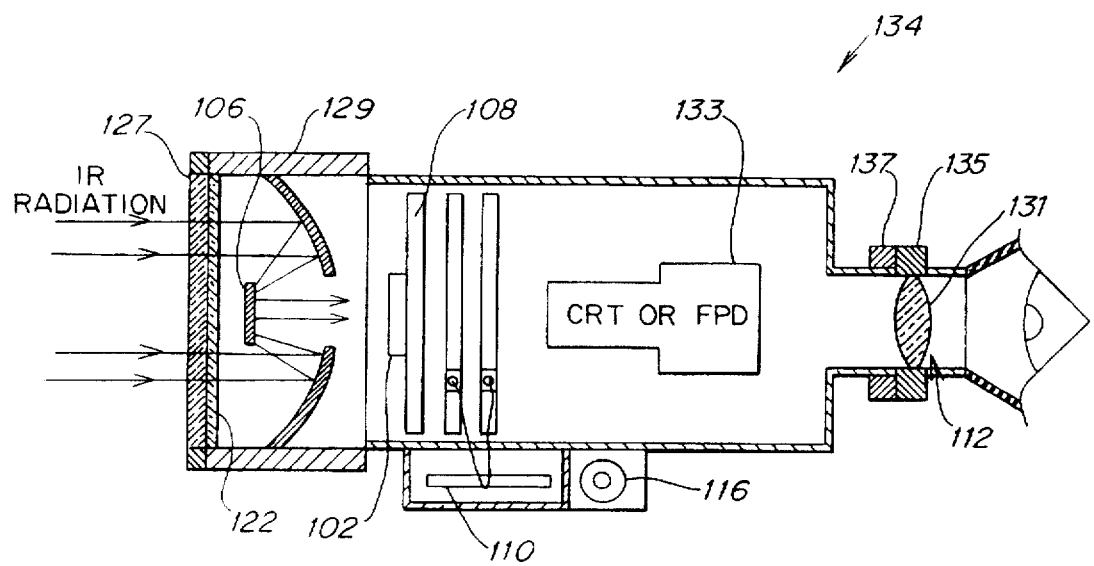
FIG. 13a
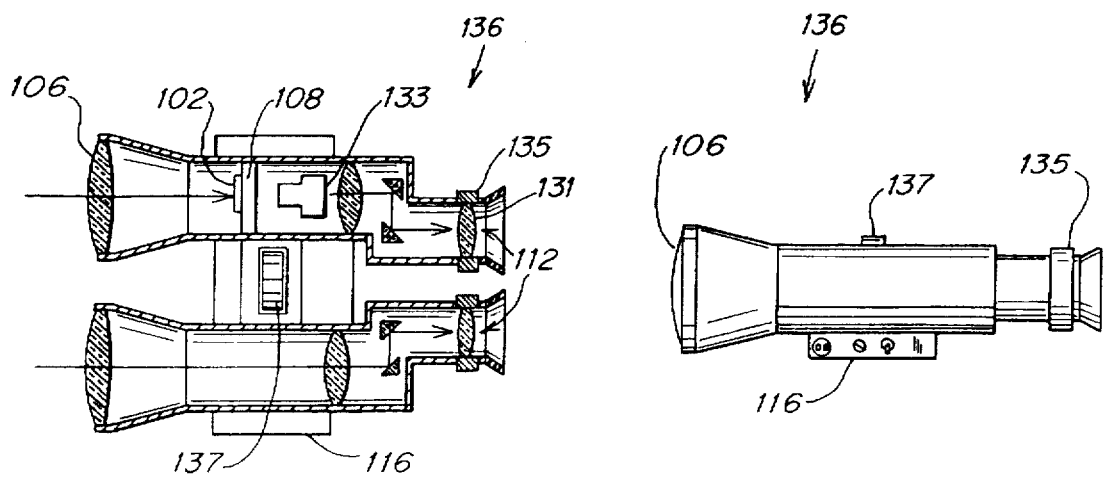 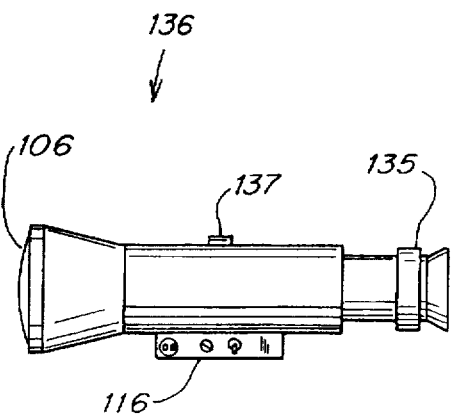
FIG. 13b                    FIG. 13c

INFRARED RADIATION DETECTOR HAVING A REDUCED ACTIVE AREA

This application claims the benefit of prior filed Provisional Application No. 60/007,909, filed Dec. 4, 1995 and entitled Antenna-Coupled Thermal Microdetectors.

BACKGROUND OF THE INVENTION

1. Field of the Invention

The invention relates generally to uncooled infrared microdetectors, and in particular, the present invention relates to a thermal detector having a microbridge structure wherein a pixel infrared radiation collecting area of the bolometer detector is greater than an active area on the microbridge structure.

2. Discussion of the Related Art

In the field of infrared (IR) detectors, it is known to provide a two-level bolometer radiation detector having a microbridge on a second plane disposed above a first plane including a silicon substrate. For example, U.S. Pat. Nos. 5,286,976 (hereinafter "the '976 patent") and 5,300,915 (hereinafter "the '915 patent") disclose a two-level, infrared bolometer detector device 10 as illustrated in FIG. 1. A bolometer is an electromagnetic radiation detector that operates by absorbing incident electromagnetic energy and converting the absorbed incident electromagnetic energy into heat. The bolometer detector device as disclosed in the '915 and '976 patents has an elevated microbridge detector level 11 and a lower level 12. The lower level 12 includes a semiconductor substrate 13 having fabricated at a top surface 14 components of an integrated circuit (IC) 15, using conventional silicon IC fabrication technology. The components of the IC are coated with a protective layer of silicon nitride 16 which protects the IC from contamination. The elevated microbridge detector level 11 includes a silicon nitride layer 20, a resistive layer 21, a silicon nitride layer 22 disposed over the silicon nitride layer 20 and the resistive layer 21, and an IR absorbing layer 23 disposed over the silicon nitride layer 22. Downwardly extending silicon nitride layers 20' and 22', deposited during the fabrication process, provide sloping support legs for the elevated microbridge detector level 11.

The '915 and '976 patents also disclose that a thin film layer 18 of reflective material can be deposited on the lower level 12, to provide a cavity 26 between the elevated microbridge detector level 11 and the lower level 12. A vertical distance d, between the reflective layer 18 and the upper microbridge detector level 11, is chosen so that incident energy passing through layers 20, 21, 22 and 23 is reflected by layer 18 upwardly and has constructive interference properties with the IR energy initially incident on the upper microbridge detector level 11. In particular the '915 and '976 patents disclose that the distance d is chosen to be substantially a quarter of a wavelength of a wavelength band of operation of the detector device, so that a phase of the reflected energy is coincident with a phase of the incident IR energy on the upper microbridge detector level. The '915 and '976 patents further disclose that the elevated microbridge detector level 11 includes a detector of the incident IR energy wherein the IR absorbing layer 23 and the resistive layer 21 make up an active area (not illustrated) of the detector.

As is known in the art, a sensitivity of the bolometer detector device 10 of FIG. 1 is a function of many factors including an absorption coefficient of each material making up the active area of the device over the desired wavelength band of operation, a physical structure of the detector including the cavity structure 26, a thermal isolation of the active area provided by the microbridge structure, and the like. In FIG. 1, the cavity 26 and the microbridge structure provide isolation of the detector's active area from its surroundings, for example the integrated circuit 15, so as to obtain higher isolation than if the active area were disposed on the top surface 14 of the semiconductor substrate 13. The microbridge structure of FIG. 1 also provides for a larger fill factor than a single level bolometer detector device disposed within the substrate 13, since the detector is disposed on the elevated microbridge detector level and the bus lines, the components of the integrated circuit, and the like are disposed on the lower level 12. It is to be understood that for this specification, the fill factor is defined as a fraction of a pixel area that is the active area of the detector. It is also to be understood that the pixel area is the area containing the bolometer detector device 10, or in other words the area within a plane of the substrate 13 that includes either one or both of the upper microbridge detector level 11 and the IC circuit on the lower level 12. In other words the pixel fill factor is the active area divided by the pixel area. Further it is to be understood that the pixel collecting area of the bolometer detector 10 is the area over which the detector device absorbs energy or in other words the area over which the detector device is responsive to incident energy.

The '915 patent discloses that the active area on the elevated microbridge detector level 11 is maximized in order to maximize the fill factor of the bolometer detector device and to therefore increase the sensitivity of the bolometer detector 10. Thus, the '915 patent discloses increasing sensitivity of the detector device 10 by increasing isolation of the bolometer detector device by placing the active area on the upper microbridge level 11, and by maximizing the size of the active area. In addition, the '976 patent discloses that in order to maximize absorption of incident IR radiation in the operating band, a thickness t of all of the layers 20, 21, 22, 23 and the distance d between the upper level 11 and the reflecting layer 18 are chosen to achieve peak absorption over the desired operating wavelength band. More specifically, the thickness t of the layers 20–23 is chosen to optimize a thermal mass of the microbridge level 11 to achieve peak absorption over the desired operating wavelength band, and the distance d is chosen to achieve constructive interference between any energy not initially absorbed by the active area that is reflected from layer 18, and the IR energy initially incident on the upper microbridge level 11.

One problem with the detector device 10 of the related art is that the pixel collecting area is substantially the same as the active area of the detector device. For example the active area may be fabricated with a minimum square area having respective lengths on a side of about 50 microns (approximately 2 mils by 2 mils). However, there is a need to provide a high resolution detector device by decreasing the pixel area, for example, providing a pixel area having sides with a length in a range of one to two wavelengths (which corresponds to 0.5 to 1 mil on a side for an operating range of wavelengths in a range from 8–12 μm). In addition, there is a need to maintain the sensitivity and time constant of larger detector devices and thus the sensitivity and the time constant of the smaller detector device should not be compromised. In other words, there is a need to provide a detector device having a smaller pixel area or a smaller pixel size while maintaining the sensitivity and the time constant of a conventional detector device. One approach to increase the resolution is to reduce the active area of the detector. It is known that the time constant ($t_c$) of the detector device is equal to the thermal capacitance of the detector divided by the thermal conductance. Thus as the active area of the detector device 10 is reduced, the thermal capacitance is reduced and the time constant correspondingly is reduced. Accordingly, a tradeoff exists between the time constant of the detector device and the size of the active area or the resolution of the detector. In particular, reducing the size of the active area (e.g. the area of the resistive layer 21) results in a reduced time constant. Thus, there is a need to increase the thermal conductance of the detector device so as to offset the decrease in the thermal capacitance of the detector device and so as to maintain the time constant of the detector device.

Further, reducing the size of the active area of the detector device 10 results in less incident energy being absorbed by the smaller active area since the energy that is incident upon the smaller active area is no longer absorbed in the portion of the device where the larger active area used to be. This results in a decrease in sensitivity of the detector device. Thus, there is a tradeoff between the sensitivity of the detector device and the size of the active area or the resolution of the detector. Accordingly, there is a need to maintain the sensitivity and the time constant of a conventional detector device while reducing the size of the active area.

A lens system disposed above an array of detectors has been attempted in order to focus a scene or image spaced remotely from an array of detectors, onto the array of detectors so as to effectively increase the pixel collecting area of the array of detectors. For example U.S. Pat. No. 4,754,139 (hereinafter the "'139 patent") discloses an IR focal plane array including a plurality of detectors and an array of radiation concentrators placed between the array of detectors and a remote image or scene. The array of radiation concentrators is used to focus the remote image or scene onto the array of detectors and purportedly permits widely spaced detectors without incurring substantial dead space on the detector plane.

However, a problem with lens systems such as shown in the '139 patent is that it is very difficult to fabricate this structure. For example, the lens complicates the structure and adds to the cost of the device. Accordingly, there is a need to be able to fabricate a structure that can increase the pixel collecting area of the detector device to be greater than the area of the active area of the detector device, without complicating the fabrication process and without incurring substantial costs. More specifically, there is a need to concentrate the incident energy not absorbed by the active area back onto the active area.

SUMMARY OF THE INVENTION

Accordingly, it is an object of the invention to improve upon conventional microbridge detector structures. It is an object of the invention to provide a microbridge detector structure having a reduced active area while maintaining an absorption sensitivity and a thermal time constant of a larger active area detector. In addition, it is an object of the present invention to provide a microbridge detector structure having an integrated concentrator that concentrates incident energy onto the reduced active area.

According to one aspect of the invention, a microbridge detector is provided with an active area that is smaller than a pixel collection area of the microbridge detector. The microbridge detector includes a semiconductor substrate and a microbridge disposed above the semiconductor substrate. The microbridge includes an active area having a pixel collection area greater than the active area of the detector. In addition, the microbridge detector includes downwardly extending leg portions that are a continuation of the microbridge and that support the microbridge above the semiconductor substrate so that a thermal isolation gap exists between the microbridge and the semiconductor substrate. Further, the microbridge detector includes electrically conductive paths within the downwardly extending leg portions that connect the active area in the microbridge to the semiconductor substrate.

In one embodiment of the present invention, the active area is patterned with alternating absorption regions and transmissive windows. In an alternative embodiment of the present invention, the active area is substantially rectangular and is located at substantially a center of the microbridge, and the downwardly extending leg portions are spirally wound around the active area and act as antennas to absorb incident electromagnetic radiation and to couple the incident electromagnetic radiation to the active area. In another embodiment of the present invention, a concentrator is disposed between the microbridge and the semiconductor substrate. The concentrator reflects incident radiation that is not initially absorbed by the active area back towards the active area.

With these arrangements, the microbridge detector is provided with a pixel collecting area that is larger than the active area of the microbridge detector, while maintaining a sensitivity and a thermal time constant of a detector device having a larger active area. In particular, with these arrangements the microbridge detector can be fabricated, for example, with a pixel resolution in a range of 0.5 to 2 wavelengths of an operating range of wavelengths of incident radiation, while maintaining an optical absorption sensitivity similar to that of devices with larger active areas, such as for example, microbridge detectors having active areas with lengths on a side in a range of greater than 3 wavelengths of the incident radiation. In addition, with these arrangements the microbridge detector device is fabricated with the concentrator disposed between the microbridge and the semiconductor substrate using existing processing technology, and thus is fabricated without further complications and added costs.

According to another aspect of the invention, the microbridge detector includes a semiconductor substrate and a microbridge disposed above the semiconductor substrate. The microbridge includes an active area. In addition, the microbridge detector includes downwardly extending leg portions that are a continuation of the microbridge and support the microbridge above the semiconductor substrate so that a thermal isolation gap exists between the microbridge and the semiconductor substrate. Further, the microbridge detector includes electrically conductive paths within the downwardly extending leg portions that connect the active area in the microbridge to the semiconductor substrate. Still further, the microbridge detector includes a means for collecting incident radiation over a collection area of the microbridge detector that is greater than the active area of the detector.

In one embodiment of the present invention, the means for collecting includes the active area patterned with alternating absorption regions and transmissive windows. In another embodiment of the present invention, the active area is substantially rectangular and located at substantially a center of the microbridge level, and the means for collecting includes the downwardly extending leg portions that are spirally wound around the active area and act as antennas to absorb incident electromagnetic radiation and to couple the incident electromagnetic radiation to the active area. In still another embodiment of the present invention, the means for collecting includes a concentrator disposed between the microbridge level and the semiconductor substrate that reflects incident radiation not initially absorbed by the active area back towards the active area.

With these arrangements, the microbridge detector is provided with a pixel collection area that is larger than the active area of the microbridge detector, while maintaining an optical sensitivity and thermal time constant of a device having a larger active area. In particular, with these arrangements the microbridge detector can be fabricated, for example, with a pixel resolution in a range of 0.5 to 2 wavelengths of an operating range of wavelengths of incident radiation. While maintaining an optical absorption sensitivity similar to that of devices with larger active areas such as, for example, microbridge detectors having active areas with lengths on a side in a range of greater than 3 wavelengths of the incident radiation. In addition, with these arrangements, the microbridge detector device is fabricated with a concentrator disposed between the microbridge and the semiconductor substrate using existing processing technology, and thus is fabricated without further complications and added costs.

According to another aspect of the invention, the microbridge detector includes a semiconductor substrate and a microbridge disposed above the semiconductor substrate. The microbridge includes an active area that is patterned with alternating absorption regions and transmissive windows to provide a pixel collection area of the microbridge detector that is greater than the active area. In addition, the microbridge detector includes downwardly extending leg portions that are a continuation of the microbridge and support the microbridge above the semiconductor substrate so that a thermal isolation gap exists between the microbridge and the semiconductor substrate. Further, the microbridge detector includes electrically conductive paths within the downwardly extending leg portions that connect the active area to the semiconductor substrate.

Accordingly to another aspect of the invention, the microbridge detector includes a semiconductor substrate and a microbridge disposed above the semiconductor substrate. The microbridge includes an active area that is substantially rectangular and located substantially at a center of the microbridge. In addition, the microbridge detector includes downwardly extending leg portions that are a continuation of the microbridge, that are spirally wound around the active area, and that support the microbridge above the semiconductor substrate so that a thermal isolation gap exists between the microbridge and the semiconductor substrate. Further, the microbridge detector includes electrically conductive paths within the downwardly extending leg portions that connect the active area to the semiconductor substrate. The electrically conductive paths act as antennas to absorb incident radiation and to couple the incident radiation to the active area. In addition, the electrically conductive paths couple a signal indicating a change in temperature of the active area in response to the incident radiation, to the semiconductor substrate.

According to another aspect of the invention, the microbridge detector includes a semiconductor substrate and microbridge disposed above the semiconductor substrate. The microbridge includes an active area. In addition, the microbridge detector includes a concentrator, disposed between the microbridge and the semiconductor substrate, that reflects incident radiation not initially absorbed by the active area towards the active area to create a pixel collection area that is larger than the active area of the microbridge detector. Further, the microbridge detector includes downwardly extending leg portions that are a continuation of the microbridge and that support the microbridge above the semiconductor substrate so that a thermal isolation gap exists between the microbridge and the semiconductor substrate. Still further, the microbridge detector includes electrically conductive paths within the downwardly extending leg portions that connect the active area to the semiconductor substrate.

According to another aspect of the invention, a method of forming the microbridge detector includes depositing a first dielectric layer above the semiconductor substrate, etching the first dielectric layer to form sloped sidewalls in the first dielectric layer, masking the first dielectric layer and etching the first dielectric layer to provide contact holes through the first dielectric layer down to contact pads on the semiconductor substrate, and depositing a thin film metal layer on the sloped sidewalls of the first dielectric layer and in the contact holes through the first dielectric layer to form a reflective concentrator and metal interconnects coupling the reflective concentrator to the contact pads. In addition, the method includes depositing a sacrificial layer on the thin film metal layer to substantially fill the reflective concentrator and to provide a substantially flat surface, depositing a supporting layer on the flat surface, depositing a resistive material of a high TCR on the supporting layer, and masking the resistive material and etching the resistive material to form an active area of the microbridge detector. Further, the method includes masking the supporting layer and etching through the supporting layer and the sacrificial layer to provide contact holes through the supporting layer and the sacrificial layer down to the reflective concentrator, depositing a second thin film metal layer in the contact holes through the supporting layer and the sacrificial layer, and masking the second metal layer and etching the second metal layer to provide electrically conductive paths between the reflective concentrator and the active area. Moreover, the method includes masking the resistive layer and the supporting layer and etching the resistive layer and the supporting layer to form the active area of the microbridge detector and to expose the sacrificial layer outside of the active area, and dissolving the sacrificial layer to provide the microbridge structure including a microbridge level having the active area disposed above the semiconductor substrate, and wherein the microbridge has a pixel collection area that is greater than the active area of the microbridge detector.

According to still another aspect of the invention, an imaging system includes an optical element that receives an electromagnetic signal, focuses the electromagnetic signal and outputs a focussed electromagnetic signal to a focal plane array. The focal plane array includes a plurality of microbridge detector devices, wherein each detector device has a pixel collection area that is greater than an active area of the microbridge detector, that converts the focused signal into a sensed signal and outputs the sensed signal to provide a plurality of sensed signals to a focal plane array processor. The focal plane array processor receives the plurality of sensed signals, processes the plurality of sensed signals to correct any gain and any offset errors between each of the plurality of sensed signals, and outputs a plurality of processed signals to a display processor. The display processor receives the plurality of processed signals and converts the plurality of processed signals into a display signal suitable for output to a display. The display receives the display signal and displays the display signal so as to display an image of a scene or object that emitted the electromagnetic signal.

According to an embodiment of the imaging system, the imaging system can be anyone of a helmet-mounted imaging system, a goggle-mounted imaging system, a monocular system, a binocular system, a weapon sight, a camcorder, a microscope, a radiometer, and a spectrometer.

BRIEF DESCRIPTION OF THE DRAWINGS

Other objects and features of the present invention will become apparent from the following detailed description when taken in connection with the following drawings. It is to be understood that the drawings are for the purpose of illustration only and are not intended as a definition of the limits of the invention.

The foregoing and other objects and advantages will be more fully appreciated from the following drawings in which:

FIG. 5b illustrates a cross sectional view of the detector device of FIG. 5a;

FIG. 6b illustrates a cross sectional view of the detector device of FIG. 6a;

FIG. 8b illustrates a cross sectional view of the detector device of FIG. 8a.

FIGS. 13a, 13b, and 13c illustrate another embodiment of the imaging system of FIG. 10 which is a hand-held imaging system, in particular FIG. 13a illustrates a monocular system and FIGS. 13b–13c illustrate a binocular system;

FIG. 14a illustrates a top view of the weapon sight and FIG. 14b illustrates a block diagram of the weapon sight;

FIG. 15a illustrates a cross-sectional view of the camcorder and FIG. 15b illustrates a block diagram of the camcorder;

FIG. 16a illustrates a side elevational view of the microscope and FIG. 16b illustrates an operational block diagram of the microscope; FIG. 17a illustrates a cross-sectional view of the imaging radiometer/spectrometer and FIG. 17b illustrates a block diagram of the imaging radiometer/spectrometer.

DETAILED DESCRIPTION

Figure 1:
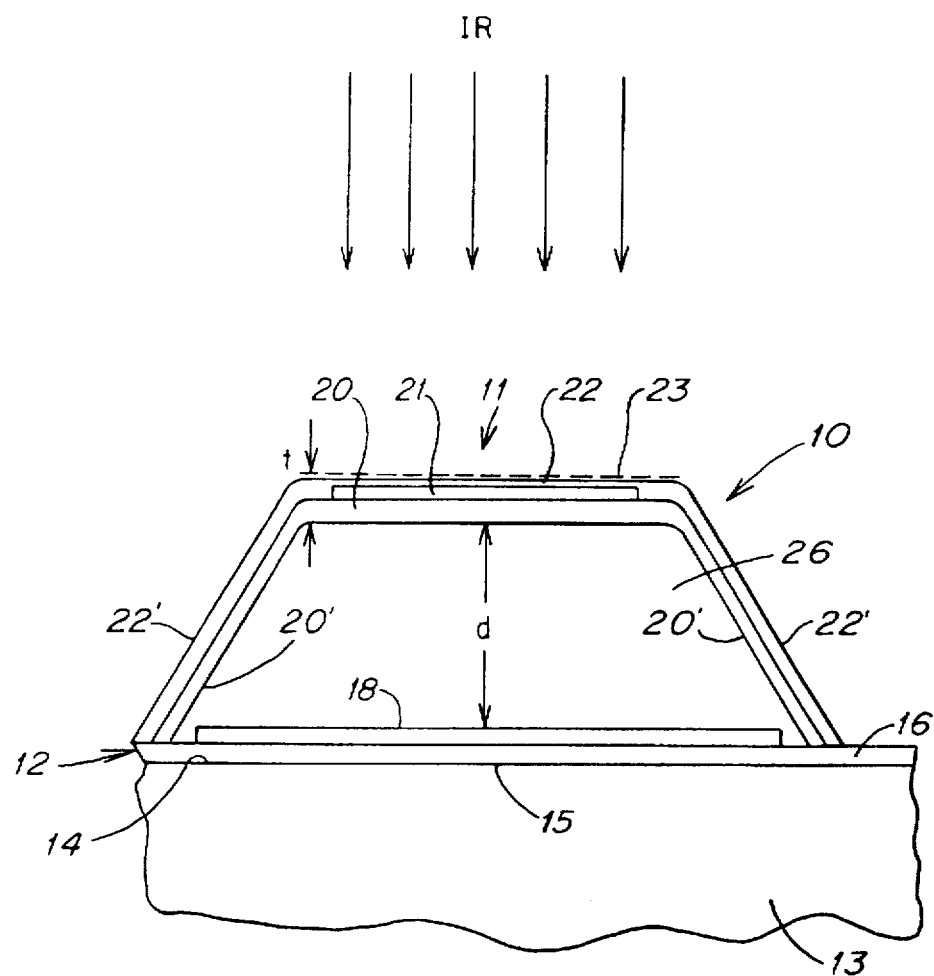
FIG. 1 illustrates a conventional two-level detector device having an elevated microbridge detector level.
Figure 2:
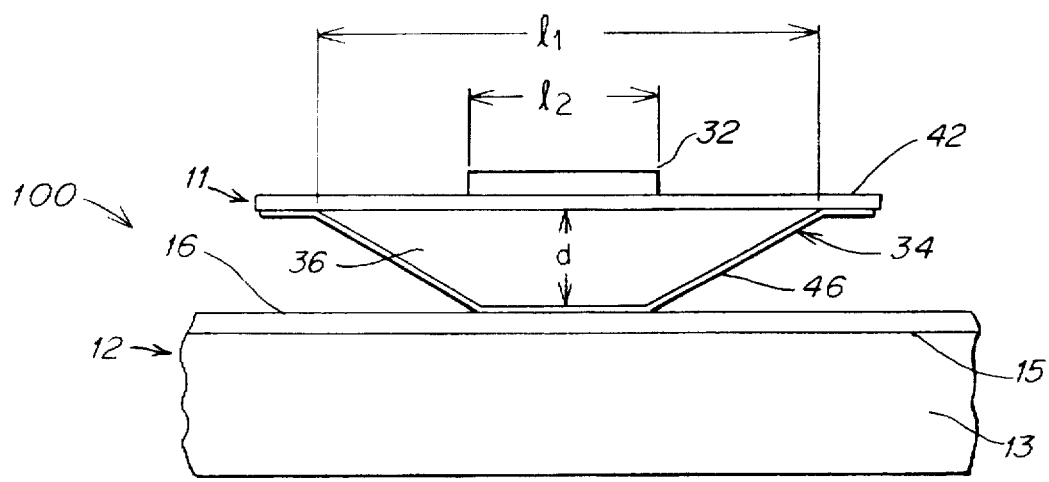
FIG. 2 illustrates a side elevation view of one embodiment of a detector device according to the present invention.

FIG. 2 is a side elevation view of a first embodiment of a detector device 100 according to the present invention. It is to be understood that for this specification a detector device is any device that includes a sensing element that provides an electrical signal in response to a sensed change in temperature within the sensing element, for example, as a result of a detected electromagnetic signal. The detector device can be, for example, a bolometer detector, a photon detector, a ferroelectric detector, a diode detector, and the like. It is also to be understood that a sensing element is any structure that measures a physical parameter such as, for example, temperature, stress, and the like. Parts similar to that of FIG. 1 are designated by like reference numbers.

As discussed above with respect to FIG. 1, the detector device 100 of the present invention has an elevated microbridge detector level 11 and a lower level 12. It is to be understood that for the present specification a microbridge is any structure that is suspended above any surface. The lower level 12 includes a semiconductor substrate 13 having fabricated thereon components of an integrated circuit 15. It is to be appreciated that numerous components such as for example diodes, FET's, bus lines, connections, contact pads, and the like can be fabricated using conventional fabrication technology and that such components are intended. In particular, an electronic readout circuit for a detector or an array of detectors such as disclosed in co-pending U.S. patent application Ser. No. 08/521,266 filed on Aug. 30, 1995, now abandoned herein incorporated by reference, can be disposed in the semiconductor substrate 13 and is intended.

As discussed above with respect to FIG. 1, there is a need to reduce a size of an active area of the detector device, while maintaining an absorption sensitivity and while maintaining a thermal time constant of the related art detector device with the larger active area, such as disclosed in FIG. 1. Referring to Equation (1), it is known to one of ordinary skill in the art that the time constant ($t_c$) of the detector is equal to the thermal capacitance (C) of the detector device divided the thermal conductance (G) of the detector device.

$$t_c = \frac{C}{G} \qquad (1)$$

The thermal capacitance of the detector device is proportional to the size of the active area of the detector device and the thermal conductance is proportional to a length (l) of conductive legs (see 38, 40 in FIG. 3) coupling the active area on the microbridge level 11 to the substrate on the lower level 12. In other words, as the active area of the detector device is reduced, the thermal capacitance goes down and thus the thermal time constant $t_c$ also goes down. In addition, as discussed above, when the size of the active area is reduced the absorption sensitivity of the detector device goes down. Thus, there is a tradeoff with each of the thermal time constant and the sensitivity of the detector device, and the size of the active area of the detector device. Accordingly, the detector device of the present invention seeks to reduce the size of the active area of the detector device while maintaining the thermal time constant and the sensitivity of a larger active area detector device.

The detector device of the present invention accomplishes the above-identified objective of maintaining the thermal time constant of the larger active area detector device by decreasing the thermal conductance (G) of the detector device, or in other words increasing the thermal isolation/resistance of the detector device, in order to maintain the desired time constant of the larger active area devices. In particular, the length 1 of the conductive legs coupling the active area on the microbridge level to the semiconductor substrate, are increased inversely proportional to the decrease in the size of the active area, to maintain the desired time constant. For example, in a preferred embodiment of the present invention, the time constant is in a range of 5 to 20 milliseconds for a wavelength band of operation in a range of 8–12 μm.

In addition, the above-identified objective of maintaining the sensitivity of the larger active area device is accomplished by providing a structure that creates an pixel collection area of the microbridge detector that is greater than the active area of the microbridge detector. In one embodiment, the detector device of the present invention is provided with a reflective concentrator that enhances absorption of incident energy with the smaller detector device active area while maintaining an optical sensitivity of larger active area devices.

More specifically, according to the embodiment of the present invention illustrated in FIG. 2, the present invention solves the problem of reducing the active area without sacrificing absorption sensitivity by providing the detector device 100 having a microbridge structure 11 with a reflective concentrator 34 between the microbridge level 11 and the lower level 12. The reflective concentrator concentrates incoming IR radiation not initially detected by the active area 32 back onto the active area. Preferably, the reflective concentrator 34 has a pixel collecting area having a dimension on a side $l_1$ in a range of about 1–2 wavelengths (corresponding to 0.5 mils to 1 mil for optical wavelengths in a range of 8 to 12 μm) and the active area has a length on a side $l_2$ of about ½ of a wavelength (corresponding to about 0.2 mils for optical wavelengths in the range 8–12 μm). The optical concentrator 34 acts to create the pixel collecting area of the detector device that is greater than the area of the active area.

Figure 3:
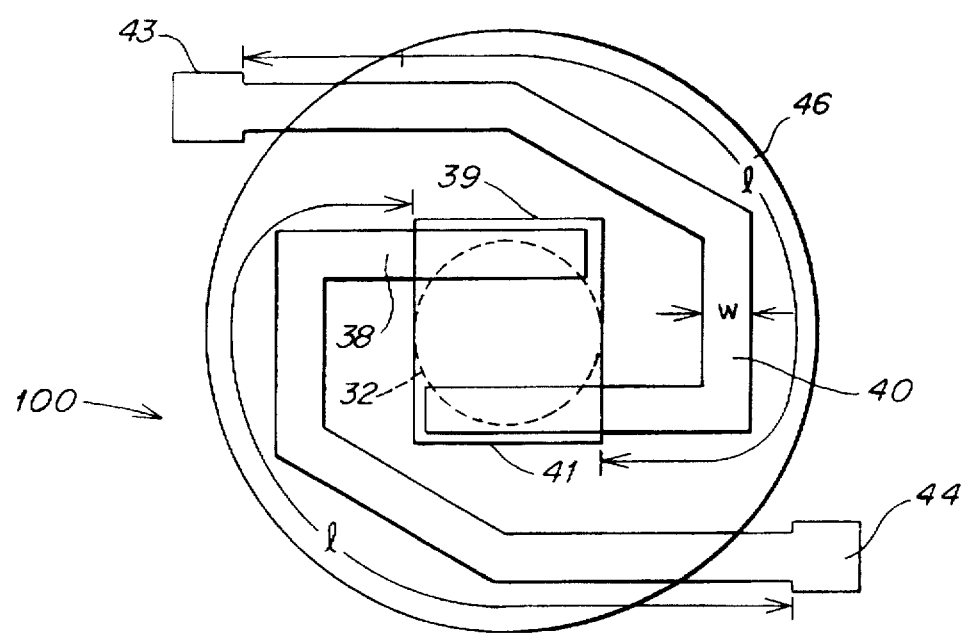
FIG. 3 illustrates a top plan view of a microbridge level of the detector device of FIG. 2.

In addition, according to the embodiment of the present invention illustrated in FIGS. 2–3, the present invention is a detector device 100 with a reduced size active area 32 but an increased thermal resistance or isolation to maintain the thermal time constant. The increased resistance or isolation, or in other words the decreased thermal conductance, is accomplished by increasing the length 1 of the conductive legs 39, 40 to offset the decrease in the thermal capacitance resulting from reducing the size of the active area. Preferably, the conductive legs are provided with a substantially equal length 1 to keep the thermal time constant in the desired operating range. In a preferred embodiment of the detector of FIG. 2, the thermal time constant is in a range of 5 to 20 milliseconds.

Referring again to FIG. 1, it is to be understood that for this specification the pixel collecting area is defined as the area over which the detector device absorbs energy that is incident onto the detector device. It is also to be understood that active area is defined as the total area that includes either one or both of the IR absorbing layer 23 and the resistive layer 21. In addition, it is to be understood that the pixel area is the area containing the bolometer detector device 10, or in other words the area within a plane of the substrate 13 that includes either one or both of the upper microbridge level 11 and the IC circuit 15 on the lower level 12. It is further to be appreciated that the fill factor is a fraction of the pixel area that includes the active area of the detector.

FIG. 3 is a top plan view of the elevated microdetector level 11 of the detector device of FIG. 2. This drawing is shown as though the active area is transparent to illustrate connections of the active area 32 to metal interconnects 38 and 40. In a preferred embodiment, the metal interconnects connect to a top surface of the active area at respective sides 39, 41 of the active area. However, it is to be appreciated that connections to any portion of the active area are possible and are intended.

As discussed above, the active area includes a resistive layer and can also include an IR absorbing layer. The active area absorbs incident IR radiation and converts the absorbed IR radiation into heat. A resulting temperature change of the active area is sensed by measuring a change of resistance of the active area, which is a function of the temperature change.

Referring to FIG. 2, the concentrator 34 is shaped to provide a distance d between the upper microbridge 11 and a bottom of the concentrator 34, and wherein the overall shape of the concentrator 34 provides constructive interference properties between energy not initially absorbed by active area 32 and reflected by concentrator 34, and the energy initially incident on active area 32. It is to be appreciated that the optical properties of the microbridge level 11 are achieved by proper selection of materials with proper optical and electrical properties. In particular, layer 42 is chosen to reflect little radiation and generally to transmit a substantial percentage of the incident IR radiation through to the concentrator 34 which in turn concentrates the incident IR radiation back onto the active area 32 to provide the increased pixel collection area. The metal interconnects 38 and 40 are connected to the active area 32 at respective sides 39 and 41 of the active area 32 and provide a detected signal to the integrated circuit 15 at the lower level 12. The detected signal corresponds to the sensed change in resistance of the active area 32. The metal interconnects 38 and 40 are constructed and arranged so as to continue down sloped walls 46 of the concentrator 34 to the lower level 12 and make electrical contact with pads 43 and 44 disposed on the lower level.

As discussed above, the detector device 100 of the present invention maintains a thermal time constant in a range of 5 to 20 ms, despite the reduction in size of the active area by decreasing the thermal conductance of the legs 38 and 40. The thermal conductance of the legs is determined as shown in the following equation:

$$G = \frac{(K)(w) \times (t)}{l} \qquad (2)$$

where G is the thermal conductance of the detector device 100, K is the thermal conductivity of the material used to provide the conductive legs 38, 40 between the microbridge level and the substrate, w is a width of the legs, t is a thickness of the material forming the legs, and l is the length of the legs between the active area 32 and the contact pads on the substrate 13. In order to fabricate detector devices of these dimensions, the width w and the thickness t of the legs are fabricated to a certain size which is typically limited by the processing technology and also by the need to be able to support the upper microbridge level 11. Accordingly, the conductance of the detector cannot be decreased to a value needed to achieve the preferred time constant by narrowing a width of the legs or by decreasing a thickness of the legs, since these dimensions are limited by processing technology.

Since the width (w) and the thickness (t) dimensions are limited by the processing technology, and since the thermal conductance is inversely proportional to the length (l) of the legs 38, 40 between the microbridge level and the level 12, according to the present invention, the length l of the legs are increased to keep the thermal time constant in the desired operating range. However, since the length (l) of the legs is to be increased, there is a need to provide sufficient space 36 between the microbridge level 11 and the substrate 12 that allows the legs to be suitably increased in length (l) to achieve the desired thermal conductance and to maintain the thermal time constant. According to the embodiment of the invention as illustrated in FIGS. 2–3, the present invention makes use of the space vacated by reducing the active area. In particular, the legs 38, 40 are wound around the active area 32 to yield the appropriate length l to achieve the desired time constant.

Figure 4:
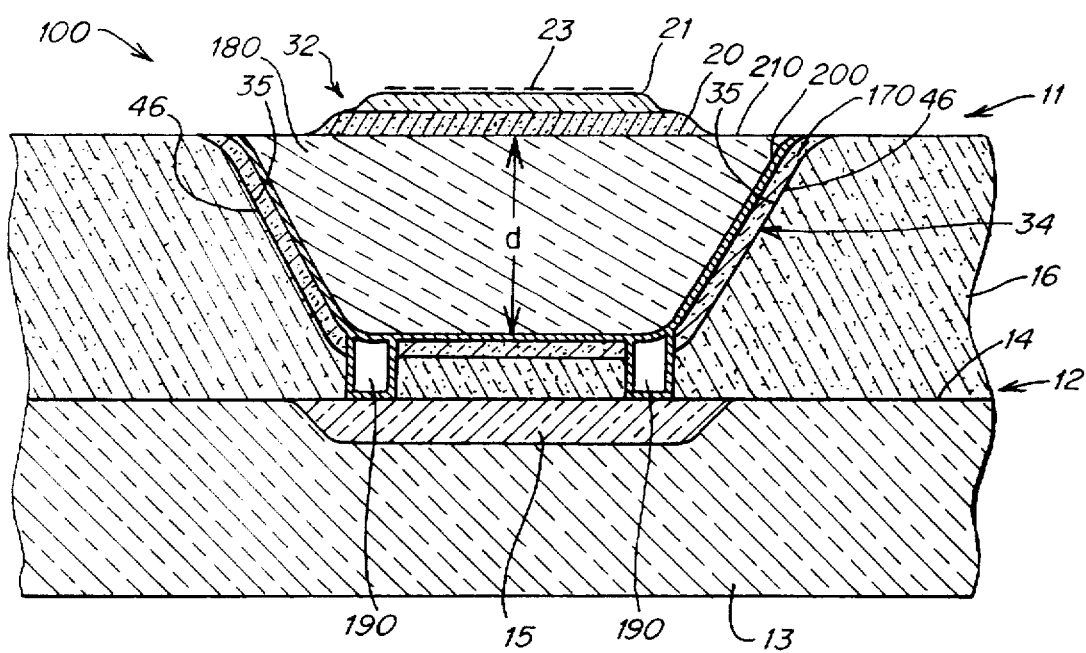
FIG. 4 illustrates various steps of a process of manufacturing the detector device of FIGS. 2–3.

The detector structure 100 of FIGS. 2–3 is fabricated using existing microbridge processing techniques with the additional benefit that the reflective concentrator 34 is provided between the microbridge level 11 and the substrate level 12. More specifically, referring to FIG. 4, the integrated circuit 15 is fabricated at the surface 14 of the substrate 13 using a standard IC process. A layer of dielectric 16, such as for example silicon nitride, is then deposited on the IC 15 and the lower level 12. The shape of the concentrator 34 is then fabricated in either the dielectric layer 16 or in an additional dielectric layer (not illustrated) deposited on top of the dielectric layer 16. The sloped side walls 46 of the concentrator 34 can be fabricated using standard sloped dry etch techniques of the dielectric. As will be discussed in more detail below, a shape and the depth d of the concentrator depend on the specifics of the cavity structure and detector device structure that is being fabricated.

A surface 35 of the reflective concentrator 34 is then passivated with a second dielectric layer 170, such as for example silicon nitride, that will not be etched by a subsequent etching step to remove a sacrificial layer 180 that is to be deposited on top of the concentrator. The sacrificial layer for example can be any easily soluble material such as for example phos-glass or undoped glass. At least one contact opening 190 is then provided in the second dielectric layer 170 by masking the second dielectric layer and etching the contact opening through each of the second dielectric layer and the first dielectric layer down to the respective contact pad 43, 44 on the substrate level 12 (See FIG. 3), or in other words down to the integrated circuit 15. A thin film layer of reflective material 200, for example such as metal film Pt or Au, is then deposited on the second dielectric layer to form the reflective surface of the concentrator 34 and to provide electrical connection from the electrical concentrator 34 to the contact pads 43, 44 of the IC 15. It is to be appreciated that the thin film layer of reflective material is removed outside of the pixel area so that a plurality of detector devices 180 can be provided that are electrically isolated from one another.

The sacrificial layer 100 of undoped glass, phos-glass, silicon dioxide, or other easily soluble material is then deposited on the reflective surface 200 of the concentrator to fill the reflective concentrator and to provide asubstantially flat surface 210. It is to be appreciated that the concentrator filled with the soluble material can include a third layer of passivation (not illustrated) disposed above the thin film metal of the reflective concentrator, if so desired. As discussed above, the depth d between the lower most point of the reflective concentrator 34 and the microbridge level 11 is provided so that incident electromagnetic radiation reflected by the concentrator 34 is reflected toward the microbridge level 11 and more specifically the active area 32 (See FIGS. 2–3), and has constructive interference properties with the electromagnetic radiation incident on the active area 32. An advantage of the concentrator 34 of the present invention is that the sensitivity of the detector device 100 is increased to provide a pixel collecting area that is larger than the area of the active area 32 of the detector device. In addition, another advantage of the concentrator 34 is that absorption is achieved over a broader range of wavelengths than occurs without the concentrator 34.

The various layers of the active area 32 are now deposited on the substantially flat microbridge surface 11. In particular, a first supporting layer 20, such as for example silicon nitride, is then deposited on the substantially flat surface of the microbridge level 11. A resistive film layer 21 having a high thermal coefficient of resistance (TCR), such as for example Vandium oxide, is then deposited on the first supporting layer to form the active area 32. The resistive film layer is then masked and etched in a pattern to form the active area 32 and to etch away the resistive film outside of the active area 32. A thin film absorbing layer 23 such as, for example, silicon nitride or a thin metal, may optionally be deposited on top of the resistive film layer if needed to increase absorption efficiency of the detector device 100.

The interconnects 38, 40 between the resistive film layer 21 of high TCR and the reflective metal layer 200 of the concentrator 34 are formed by masking in a pattern and etching contacts through the first supporting layer 20 of the microbridge level 11 and the sacrificial layer 180 down to the reflective materials 200 of the concentrator 34. An interconnect metal layer (not illustrated) is then deposited, masked in a pattern, and etched to provide the electrical contacts 38, 40 between the resistive film layer and the reflective layer. It is to be appreciated that although not necessary, a layer of passivation material may be deposited on top of the interconnect metal layer to protect the interconnect metal layer.

The absorbing layer 23, the resistive film layer 21, and the first supporting layer 20 are then masked to define the shape of the active area 32. The areas outside of the active area are then etched down to the sacrificial layer 180 filling the reflective concentrator 34 to substantially expose the sacrificial layer. The sacrificial layer is then dissolved using a selected etching process that removes the sacrificial layer without removing the layer of the active area and the metal connections to the reflector so that the active area 32 is suspended over the concentrator 34 and is thermally isolated from the lower substrate level 12 and electrically connected to the substrate level 12 by the metal interconnects 38, 40.

It is to be appreciated that an advantage of the embodiment of FIGS. 2–3 of the present invention is that the concentrator 34 can be provided between the active area 32 and the substrate level 12 using conventional processing techniques. In addition, it is to be appreciated that another advantage of the embodiment of FIGS. 2–3 is that the metal interconnects 38, 40 connecting the resistive film layer 21 of the active area 32 and the integrated circuit 15 on the substrate level 12, are formed through the reflective concentrator 34 eliminating any need to use space outside of the reflective concentrator to provide the metal interconnects.

It is further to be appreciated that according to the present invention, the geometric design of the concentrator 34 is not significant as compared to the overall effect of the concentrator 34. For example, the concentrator 34 although not a perfect parabolic reflector acts substantially like a parabolic reflector over the desired operating wavelength band of interest. As shown in the embodiment of FIGS. 2–3, the concentrator 34 can be curved, for example in the shape of the truncated horn antenna. However, it is to be appreciated that any shape known to one of ordinary skill in the art which acts to concentrate energy not initially absorbed by active area 32, back onto active area 32 and that creates an optical collection area greater than the area of the active area is within the scope of the present invention and that such modifications are intended. One example is a parabolic reflector. Another example is illustrated in FIGS. 5a–5b which are a perspective view and a cross sectional view of another embodiment of a detector device, according to the present invention.

Figure 5A:
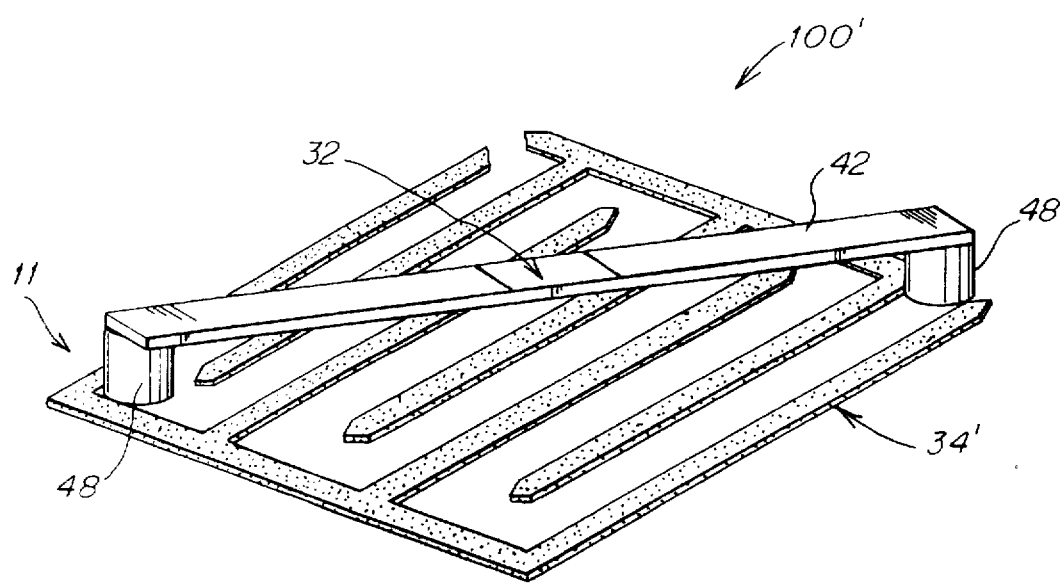
FIG. 5a illustrates a perspective view of a detector device according to another embodiment according to the present invention.
Figure 5B:
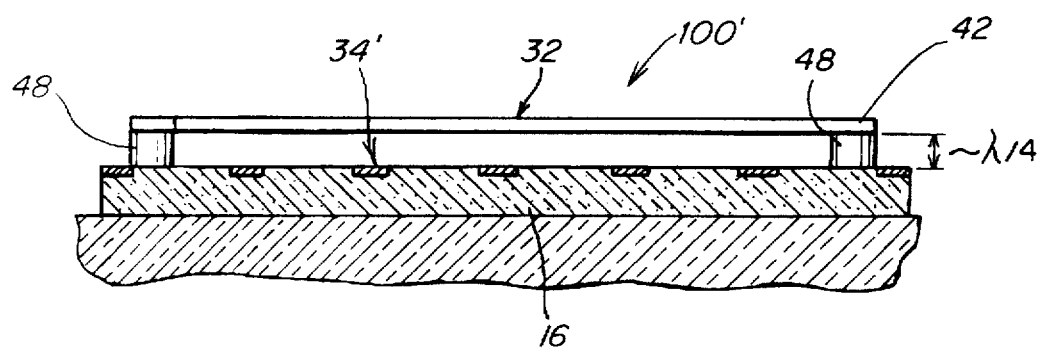

In FIGS. 5a–5b, like components are designated with like reference characters. In the embodiment of FIGS. 5a–5b, the optical concentrator 34' is a flat structure, in contrast to the curved structure of FIGS. 2–3. The embodiment of FIGS. 5a–5b includes standoffs 48 which provide support for supporting layer 42 and active area 32. It is to be appreciated that although not illustrated, the embodiment of FIGS. 5a–5b may also include a semiconductor substrate 13 and associated integrated circuitry 15 as discussed above with respect to FIGS. 2–3. Otherwise, the embodiment of FIGS. 5a–5b operates in the same manner as discussed above with respect to FIGS. 2–3. In particular, the optical concentrator 34' concentrates incident energy onto the active area 32 to create an optical collection area greater than area of the active area 32. The concentrator 34' reflects energy at edges of the concentrator 34' almost instantly while delaying energy incident on the concentrator 34' within the body of the concentrator so that the reflected energy arrives at the active area 32 at the same time from all portions of the concentrator 34' and so that it constructively adds to the energy initially incident on the active area 32.

Fabrication of the detector device structure 100' of FIGS. 5a–5b utilizes existing processing techniques such as disclosed in the '976 and the '915 patents with the added benefit that the reflective layer 18 (See FIG. 1) is patterned to result in a pattern similar to that shown in FIGS. 5a–5b.

An advantage of the embodiments of FIGS. 2–5a–5b of the present invention is that the detector device has a reduced size active area and thus an increased resolution, for example having a length on a side in a range of half a wavelength of the operating wavelength range, while having an increased pixel collecting area. In addition, another advantage is that the embodiments have an optical absorption sensitivity and thermal time constant similar to that of devices with larger active areas (e.g. having an active area with a length on a side greater than 3 wavelengths for energy in the 8–14 µm range). In a preferred embodiment of the present invention, the detector device of FIGS. 2–5a, 5b is provided with an optical collection area equivalent to a device having an active area having a length on a side in the range of 1–2 wavelengths, while the active area has a length on a side in the range of a half of a wavelength. In addition, in the embodiment of FIGS. 2–4 the space vacated by the active area is used to increase the length of metal interconnects 38 and 40 in order to maintain the thermal time constant, in the desired operating range of 5 to 20 mS. Therefore, the embodiments of FIGS. 2–5a, 5b achieve smaller pixel resolution size while maintaining the optical absorption sensitivity and the thermal time constant of larger active area devices.

According to another aspect of the present invention, a detector device is provided with an active area having a reduced fill factor as compared to the related art detector devices such as illustrated in FIG. 1, while maintaining the sensitivity and time constant of the related art devices. In particular, according to this aspect of the invention, either one or both of the absorbing layer 23 and the resistive layer 21 of high TCR, is patterned with a result that absorption of incident energy by the pixel collection area is maintained even though the overall fill factor of the detector device is decreased.

Figure 6A:
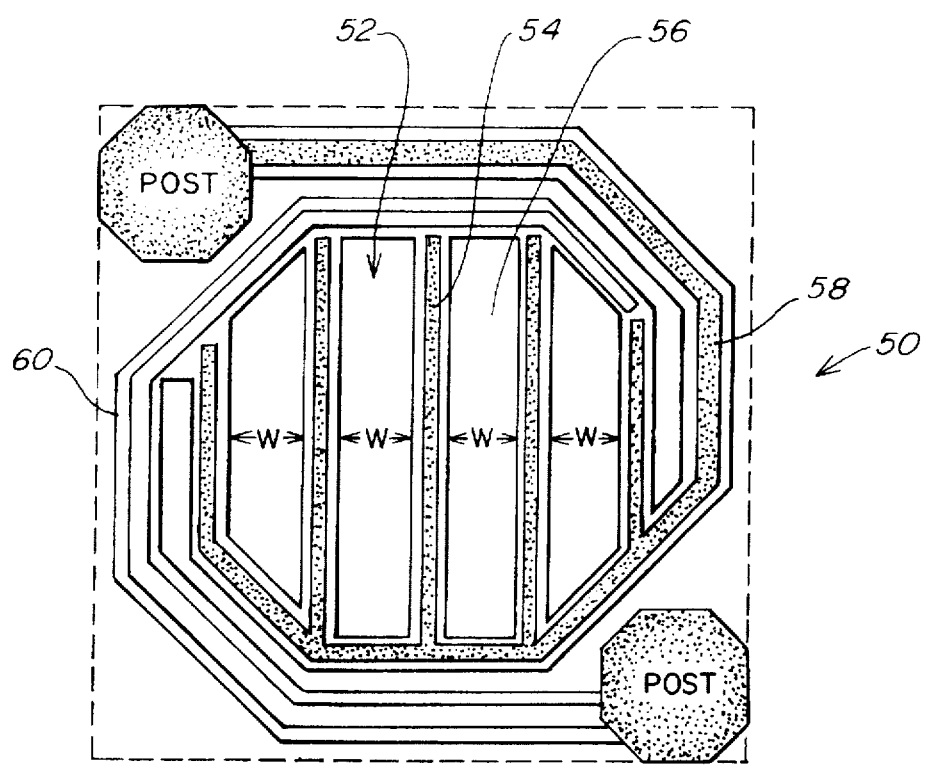
FIG. 6a illustrates a top plan view of a microbridge level of another embodiment of a detector device according to the present invention.
Figure 6B:
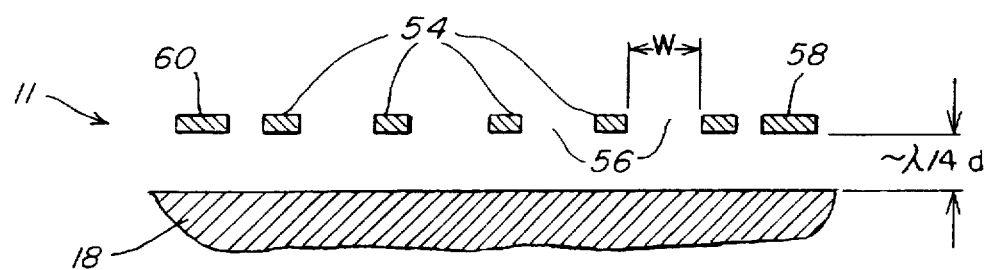

FIGS. 6a and 6b illustrate a top plan view and a side elevation view, respectively, of a microbridge level of a detector device having a reduced fill factor, according to the present invention. In the embodiment 50 of FIG. 6a, active area 52 is patterned to include interdispersed electrically conductive areas 54 (absorbing elements) and transmissive windows 56. In particular, in the embodiment of FIGS. 6a–6b a plurality of linear optical absorption elements 54 are interspersed with a plurality of transmissive windows 56. The linear absorption elements 54 comprise a resistive layer of high temperature coefficient of resistance (TCR) material. In addition it is to be appreciated that the linear absorption elements may also include a layer of absorbing material. it is to be appreciated that the absorbing material can be laid over the high TCR material, or disposed between layers of high TCR material, or disposed beneath the high TCR material and that such modifications are intended. A width w of the transmissive windows 56 is chosen such that they are substantially smaller than a wavelength of a desired operating range of wavelengths of the incident radiation on the detector device 50. By choosing the width w appropriately, absorption with the absorbing elements 54 is substantially equivalent to a solid active area, such as disclosed in FIG. 1. Therefore, an advantage of the present invention is that the active area is provided with a reduced fill factor while maintaining a sensitivity of a detector having an active area with a larger fill factor, for example, such as the related art of FIG. 1. In addition, another advantage of the present invention is that the active area has a pixel collecting area that is greater than the active area of the detector device.

Referring to FIG. 6b, there is illustrated a vertical distance d between the reflective layer 18 and the upper level 11, comprising the plurality of absorbing elements 54 and the plurality of transmissive windows 56. The vertical distance d is preferably a quarter of a wavelength so that reflected incident energy from layer 18 is upwardly reflected to the absorbing elements 54 and has interference properties such that significant absorption is achieved over a preferred range of wavelengths, for example in a range of 8–14 µm. More specifically the distance d is preferably a quarter of a wavelength to achieve a total path length of a half of a wavelength and thus to achieve constructive addition of the reflected energy and the incident energy. It is to be appreciated that although not specifically illustrated in FIGS. 6a and 6b, the active area of FIGS. 6a–6b can be used as a basis for any of the detector devices as illustrated in any of FIGS. 1–5, and is intended.

Figure 7:
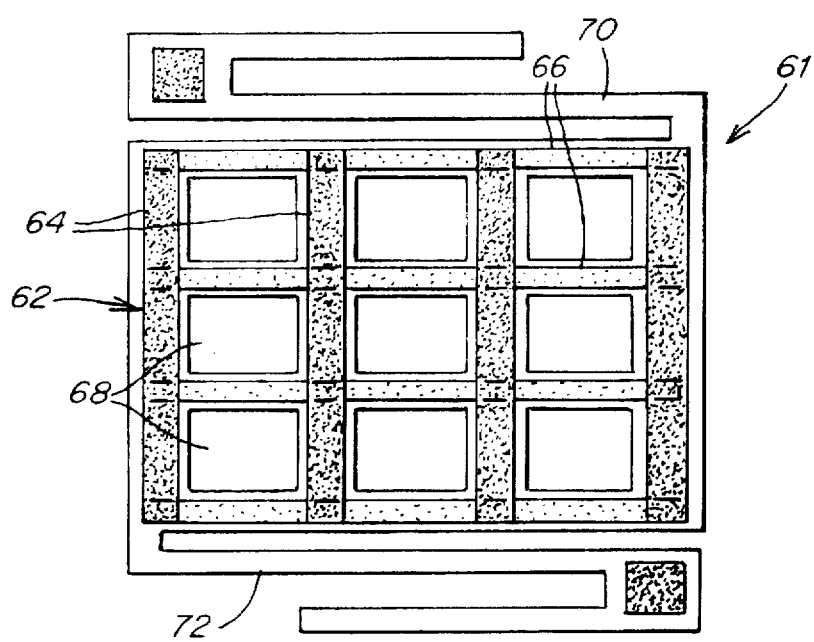
FIG. 7 illustrates a top plan view of a microbridge level of a detector device according to another embodiment of the present invention.

One disadvantage of the embodiment disclosed in FIGS. 6a–6b, is that it is linearly polarized in the longitudinal direction of the absorbing elements 54. In contrast, FIG. 7, illustrates a top plan view of a microbridge level of a detector device 61 according to an alternative embodiment of the present invention. In this embodiment, the active area 62 includes vertical absorbing elements 64 and horizontal absorbing elements 66 interdispersed with a plurality of transmissive windows 68 to form a grid structure. An advantage of this embodiment of the present invention is that it is not polarized. As discussed above, conductive leads 70 and 72 provide support of the active area disposed on the microbridge level and also couple a sensed signal from the active area to the substrate level. In one embodiment of the microbridge level 61 of FIG. 7, the vertical absorbing element 64 and the horizontal absorbing elements 66 comprise a resistive layer of high TCR material. However it is to be appreciated that either one or both of the vertical absorbing elements 64 and the horizontal absorbing elements 66 may also include a layer of absorbing material. In addition it is to be appreciated that either one or both of the vertical absorbing elements and the horizontal absorbing elements can include an absorbing layer, a layer of high TCR material, or both an absorbing layer and a high TCR material layer, and that such modifications are intended. The operation and advantages of the active element of FIG. 7 are otherwise the same as that of the active element of FIG. 6. In particular, the active element has a reduced fill factor while maintaining a sensitivity of a solid active area and also provides a pixel collecting area greater than the active area of the detector device. In addition, another advantage of the embodiment of FIG. 7 is that it is not polarized as to collecting incident energy.

Figure 8A:
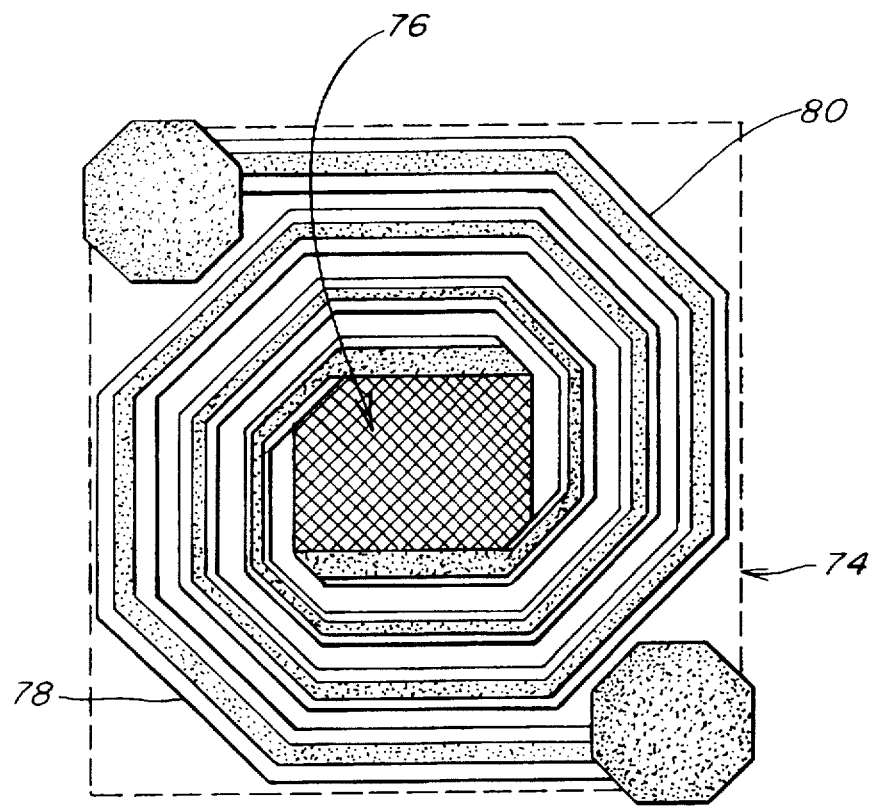
FIG. 8a illustrates a top plan view of a microbridge level of a detector device according to another embodiment of the present invention.

Referring now to FIG. 8a there is illustrated a top plan view of a microbridge level 74 of a detector device according to still another embodiment of the present invention. In particular, the microbridge level 74 includes an active area 76 disposed substantially within a center of the microbridge level 74 and conductive leads 78 and 80. The active area 76 is a square area that is reduced in size as compared to the active area of the related art of FIG. 1, for example having a length on a side in a range of a half wavelength, and includes a layer of resistive material of high TCR. It is be to appreciated that the active area may also include an absorbing layer as discussed above. In addition, the conductive leads 78 and 80 also comprise an electrically conductive layer, and a resistive layer of high TCR material. It is also to be appreciated that the leads 78, 80 may also include a layer of absorbing material. According to this embodiment of the present invention, the active area 76 and the legs 78 and 80 combine to yield an effective active area of the device. In particular, legs 78 and 80 are patterned in a spiral fashion and act as antennas wherein energy incident on the spiral conductive leads 78 and 80 is coupled to the active area at the center of the microbridge level 74. Legs 78 and 80 also act to couple the detected signals reflecting a sensed change in temperature of the active area 76 to the lower level 12. Thus, the conductive leads 78 and 80 have a dual purpose in the embodiment of FIGS. 8a and 8b.

As discussed above, an advantage of this embodiment is that the overall active area including square area 76 and the legs 78 and 80 has a reduced fill factor when compared to the overall active area of the related art devices, such as shown in FIG. 1, while maintaining the sensitivity of the related art devices. In addition, another advantage is that the device has a pixel collecting area greater than the active area.

Figure 8B:
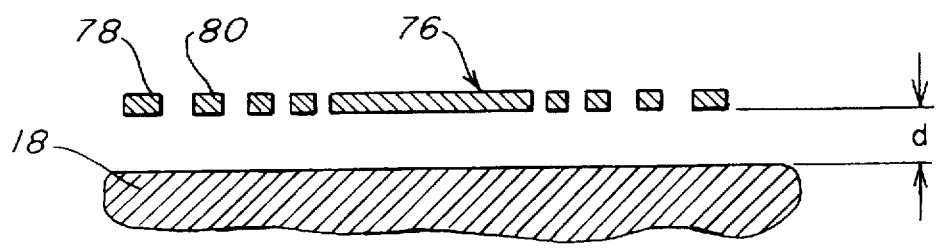

FIG. 8b, illustrates a side elevation view of the microbridge detector device of FIG. 8a. The vertical distance d between the microbridge level 74 and the reflector 18 is preferably a quarter of a wavelength so as to reflect any radiation incident upon the reflective layer 18 back towards the microbridge level 74 and so as to provide interference properties such that significant absorption is achieved over a preferred range of wavelengths, for example in a range 8–14 µm. In particular, the distance d is preferably substantially a quarter of a wavelength of the operating range of wavelengths of the device.

Fabrication of the detector devices of FIGS. 6a, 6b–8a, 8b utilize existing processing techniques such as disclosed in the '976 patent and the '915 patent, with the exception that at least one of the resistive layer of high TCR material and the absorbing layer is masked and etched to form the patterning of the active area as disclosed in each of FIGS. 6a, 6b–8a, 8b.

Figure 9:
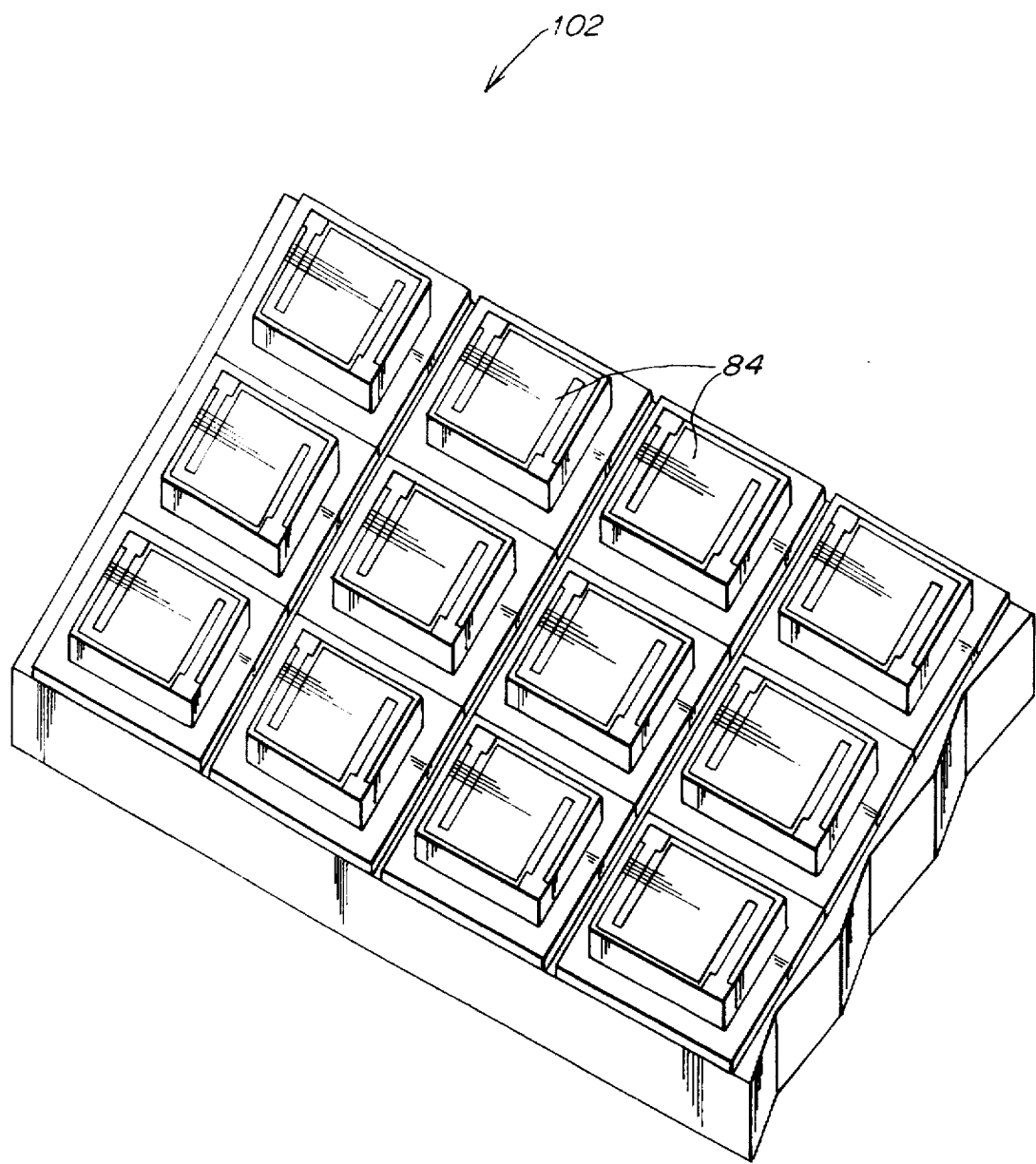
FIG. 9 illustrates a perspective view of an array of detector devices utilizing any of the embodiments of detector devices illustrated in FIGS. 2–8a, 8b according to the present invention.

Although the above description has been in terms of individual detector devices, the invention is also directed to an array assembly, in particular to array in the in x and y dimensions of a plurality of detector devices thereby forming a focal plane array. In particular, FIG. 9 illustrates a perspective view of a focal plane array 102 of microbridge detector devices 84. It is to be appreciated that any of the microbridge detector devices discussed above and illustrated in FIGS. 2–8a, 8b can be used in the array of FIG. 9. In one embodiment of the present invention, an array of 327 detector devices disposed in a row along the x direction by 245 detectors disposed in a column along the y direction are provided on a semiconductor substrate, wherein each detector or pixel device covers an area about 46 microns on a side. The semiconductor array operates over the IR wavelength range of 8–14 µm, and has an IR sensitivity of at least 80%.

Figure 10:
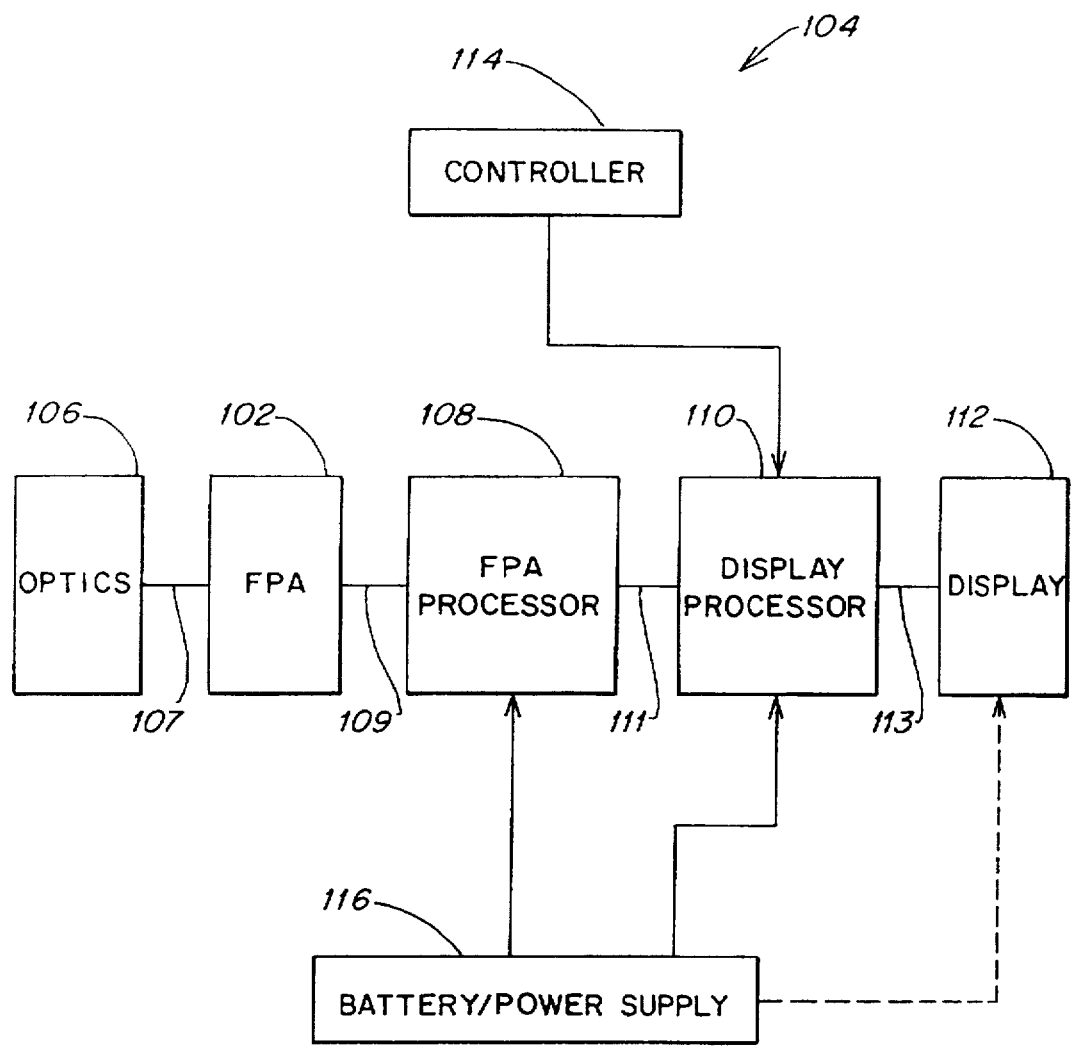
FIG. 10 illustrates a block diagram of an imaging system of the present invention.

It is to be appreciated that an uncooled focal plane array 102 of the present invention can be used in an imaging system 104, such as illustrated in the block diagram of FIG. 10. With the imaging system of FIG. 10, electromagnetic radiation such as, for example, infrared radiation in a wavelength ranges of 8–14 µm or 3–5 µm, incident upon the optics 106, is focussed by the optics such as, for example, a lens to provide a focussed electromagnetic signal at output 107. The focussed electromagnetic signal is imaged onto the uncooled focal plane array 102. The focal plane array converts the focussed electromagnetic signal to a plurality of sensed signals that are output on medium 109, to a focal plane array processor 108. The focal plane array processor 108 processes the plurality of sensed signals such as, for example, by digitizing the plurality of sensed signals to provide a plurality of processed signals and by adjusting the plurality of processed signals for any differences in gain or other non-uniformities between the plurality of detector devices of the focal plane array. The plurality of processed signals are then output on medium 111 to a display processor 110. The display processor reformats the plurality of processed signals into a plurality of display signals in a format suitable for display on display 112, and outputs the display signals to the display on medium 113. It is to be appreciated that the display processor may perform any display processing of the processed signals known to one of ordinary skill in the art such as, for example, reformatting for the display signals, eliminating bad pixel data, focus adjustment, addition of symbols and/or other information to the display signals, adjustment of brightness and/or contrast, and the like. A controller 114 provides automatic and/or manual control of the display processor to allow automatic and/or manual adjustment of the various display parameters such as for example, the brightness, the contrast, adding symbols, and the like. The imaging system is powered by supply electronics 116 which may include any one of a battery, an AC power supply, or a DC power supply 116.

The imaging system of FIG. 10 generally provides a 2-dimensional real-time display of an image for an operator of the system to view. For example, in a preferred embodiment of the imaging system of the present invention, the uncooled focal plane array 102 is configured to operate over at least one infrared (IR) wavelength band of interest. With this system, the operator can view thermal signatures of objects and/or scenery under conditions where the human eye would not normally be able to see the objects and/or scenery. For example, the imaging system may be used at night, in the day without washout conditions, in the presence of smoke, or in degraded weather conditions.

Figure 11A:
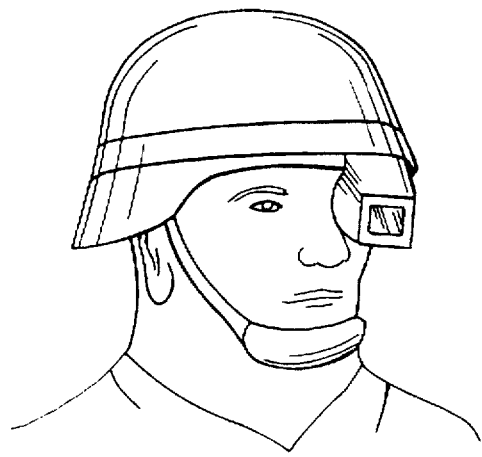
FIGS. 11a, 11b, and 11c illustrate, respectively, a helmet mounted and a goggle mounted configuration of a head mounted embodiment of the imaging system of FIG. 10.
Figures 11B, 11C:
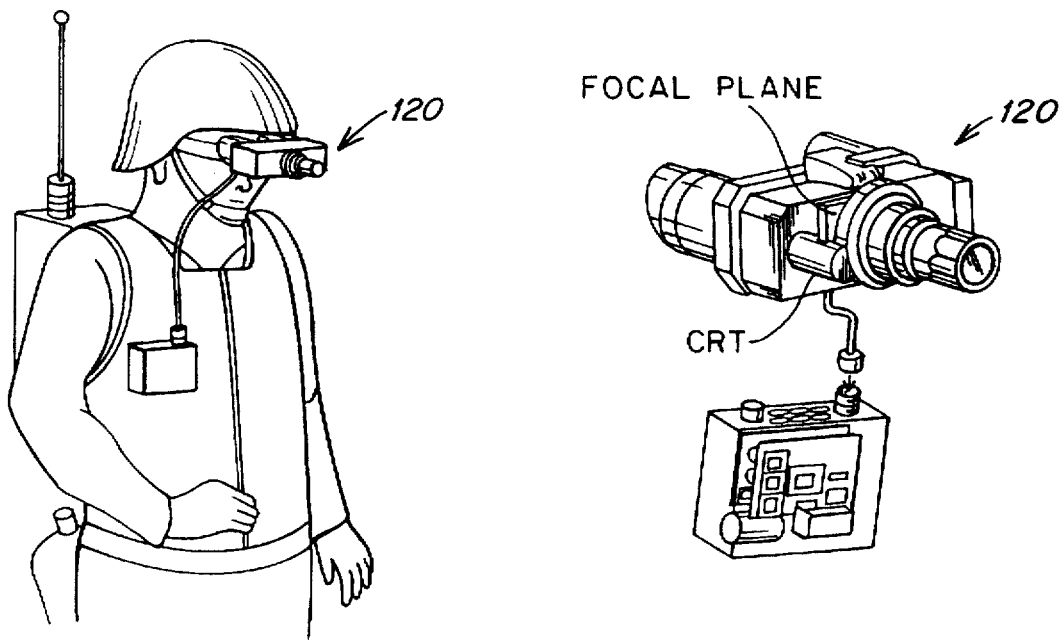

One example of a thermal-imaging system in which the focal plane array of the present invention can be utilized is a head mounted imaging system 120 as illustrated in FIGS. 11a–11b. FIG. 11a illustrates a helmet mounted configuration of the head mounted imaging system, and FIG. 11b illustrates a goggle configuration of the head mounted imaging system, and 11c is an enlarged view of the imaging system by itself.

Figure 12:
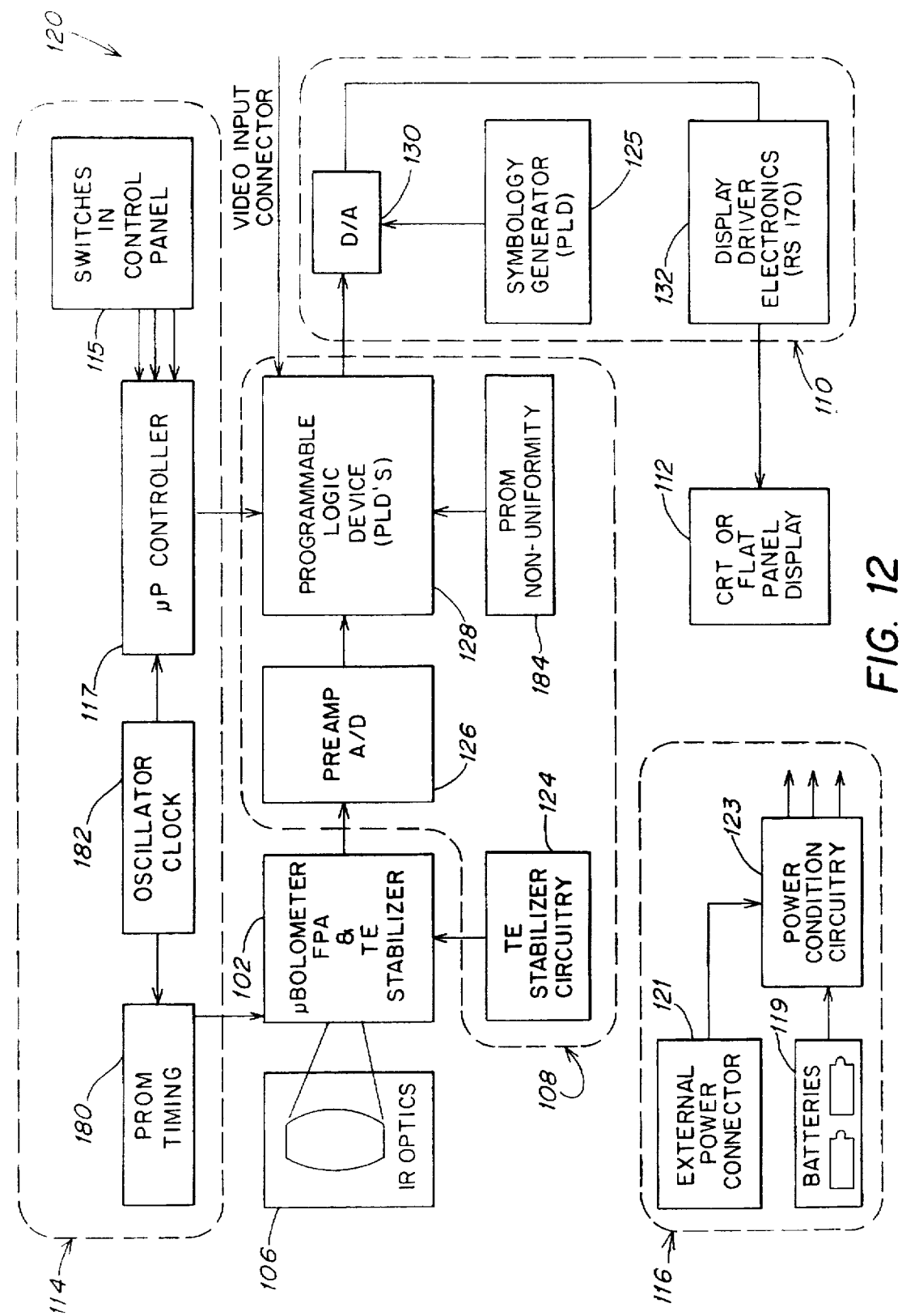
FIG. 12 illustrates a block diagram of the head mounted imaging system of FIGS. 11a, 11b, and 11c.

FIG. 12 illustrates a block diagram of the head mounted imaging system 120 of FIGS. 11a–11b. It is to be appreciated that parts similar to the imaging system illustrated in FIG. 10 have been identified with similar reference numbers and any description of these parts is not repeated here. With the head mounted imaging system of FIG. 12, an electromagnetic signal is focussed by the optics 106 onto the focal plane array 102. The focal plane array 102 is temperature stabilized with the aid of temperature stabilizing circuitry 124 contained within the focal plane array processor 108. The focal plane array 102 converts the focussed signals into sensed signals and outputs the plurality of the sensed signals to the focal plane array processor 108. The focal plane array processor amplifies and digitizes each of the plurality of sensed signals with a preamplifier and analog-to-digital converter 126, and outputs a plurality of processed signals to the display processor 1 10. The focal plane array processor also includes a programmable logic device 128 that processes the plurality of processed signals to correct any offsets or gain differences between the plurality of processed signals and to eliminate any bad signal data. The display processor reformats the corrected signals and converts the corrected signals to an analog signal via a digital-to-analog converter 130, so that the analog signal is in a format suitable for display. A display driver 132 then outputs the analog signal to the display 112 for display to the user.

As discussed above, the controller 114 provides automatic and/or manual control of the display processor to provide automatic and/or manual adjustment of various display parameters. The controller of the head mounted system includes switches 115 in a control panel, and a microprocessor 117. In addition, the supply electronics 116 includes batteries 119, or a connector for external power 121, as well as power conditioning circuitry 123. Further, the display processor 110 reformats the plurality of processed signals into the display signal and includes a symbology generator 125 for providing symbols on the display.

In a preferred embodiment of the head mounted system 120, the focal plane array 102 is operated in at least one IR wavelength band, for example over the 8–14 µm range. In addition, the display 112 can be either a one eye or two eye display for the system user, and can be adjusted with the aid of the controller 114. In a preferred embodiment, the focal plane array processor 108 and the display 112 are mounted in the helmet or within the face mounted goggles. In addition, the display processor 110, the controller 114, and the supply 116 are provided in a unit that can be vest mounted. However, it is to be appreciated that any variation known to one of ordinary skill in the art, such as for example, mounting each of the above in the helmet or goggles, is contemplated and intended to be within the scope of the present invention.

An advantage of the head-moutlinted imaging system is that it is a self-contained, portable unit having a reduced size, weight and power consumption. In particular, the focal plane array does not require cooling, or mechanical scanners or choppers as required by prior art devices. In addition, the head mounted system can operate in darkness, in the daytime without washout in contrast to prior art devices that use an image intensifier tube, can penetrate smoke, and the like. Further, for the reasons discussed above with respect to the detector device and the focal plane array, the head mounted system has an improved reliability and sensitivity as compared to the prior art devices.

Another example of an imaging system using the focal plane array of the present invention is a hand-held imaging system such as is illustrated in FIGS. 13a, 13b and 13c. The hand-held imaging system can be a monocular system 134 such as illustrated in FIG. 13a or a binocular system 136 such as illustrated in FIGS. 13b and 13c. It is to be appreciated that parts similar to the imaging system of FIG. 10 are labeled with similar reference numbers, and any description of these elements is not repeated. The monocular system of FIG. 13a includes a window 127 having an optical filter 122 disposed in front of the IR optics 106, and a focus ring 129 that focuses the incident electromagnetic radiation onto the IR optics. In addition, the display 112 includes an eye piece 131 which acts in combination with a CRT or FPD 133 to provide the display. The eye piece display 112 also has a diopter adjustment 135, and a focus knob 137, as known to one of ordinary skill in the art. In a preferred embodiment of the hand-held imaging system of FIGS. 13a, 13b and 13c, the supply electronics 116 is a battery, and the focal plane array operates over at least one IR wavelength range to yield a long range IR telescope or binoculars that can be used in darkness, in daylight, to penetrate smoke, and the like. In addition, the long range telescope and binoculars are self-contained units having a reduced side, weight and power consumption, while providing an increased reliability and sensitivity.

Figure 14A:
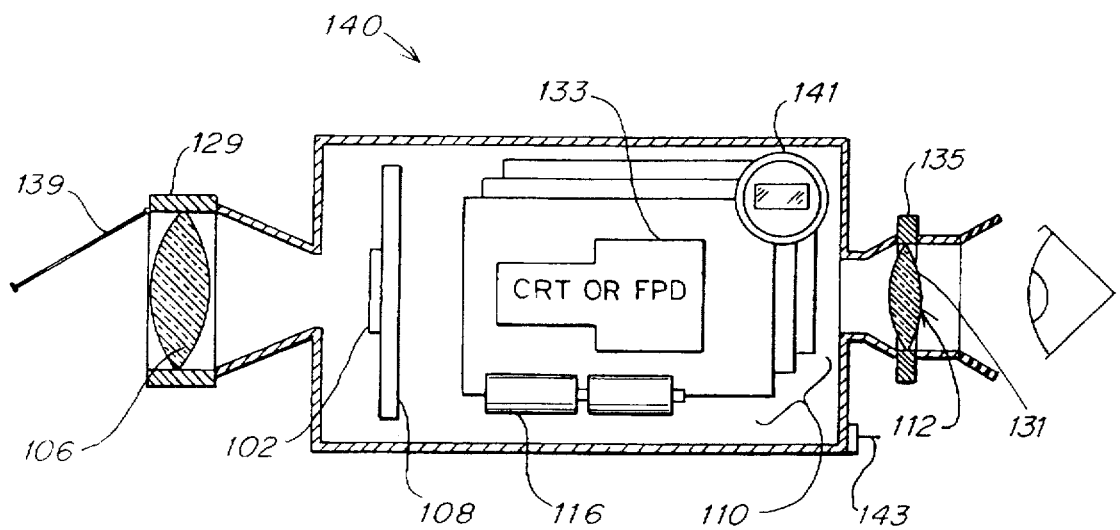
FIGS. 14a and 14b illustrate another embodiment of the imaging system of FIG. 10 which is a weapon sight; in particular
Figure 14B:
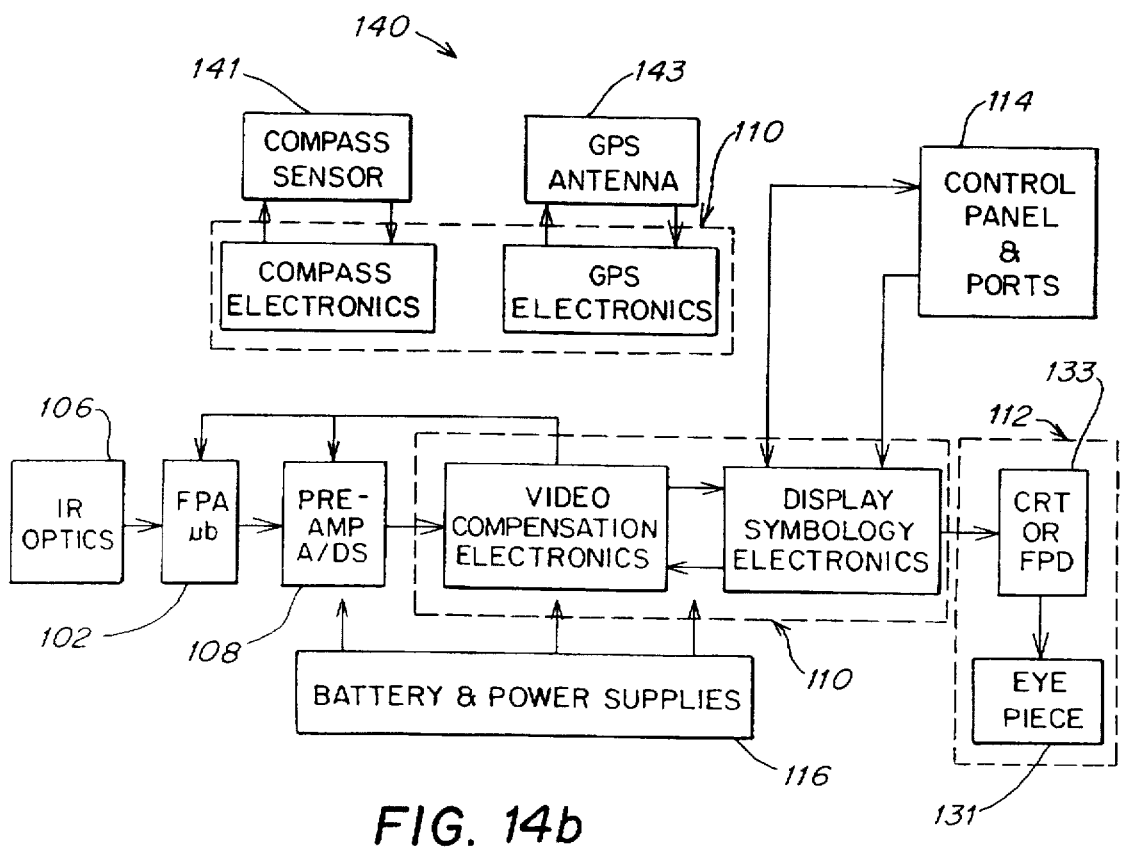

A further example of an imaging system that may use the focal plane array 102 of the present invention is a weapon sight 140, such as is illustrated in FIGS. 14a–14b. FIG. 14a illustrates a top view of the weapon sight according to the present invention, and FIG. 14b illustrates a block diagram of the weapon sight of FIG. 14a. It is to be appreciated that parts similar to the imaging system of FIG. 10 are identified with similar reference numbers, and any description thereof is not repeated. The weapon sight also includes a cover 139 that covers the lens 106, a focus ring 129 for adjusting the focus of the focused signals from the lens 106 onto the focal plane array 102, a compass 141, and a global positioning system (GPS) antenna 143. The display processor 110 includes additional electronics for processing the GPS signal and the compass information. In a preferred embodiment of the weapon sight of FIGS. 14a–14b, the optical lens 106 also includes a filter, the supply electronics 116 are batteries, and the display 112 includes the eye piece, a CRT or FPD 133, and a focus adjustment knob 135. The preferred embodiment of the focal plane array is operated in at least one desired IR wavelength band of interest to provide a long-range weapon sight, such as a rifle mount, that can be used to penetrate darkness, to penetrate smoke, can be used in the daytime, and the like. In addition, the weapon sight 140 of the present invention is a self-contained unit having a reduced size, weight, and power consumption, while providing an increased reliability and sensitivity.

Figure 15A:
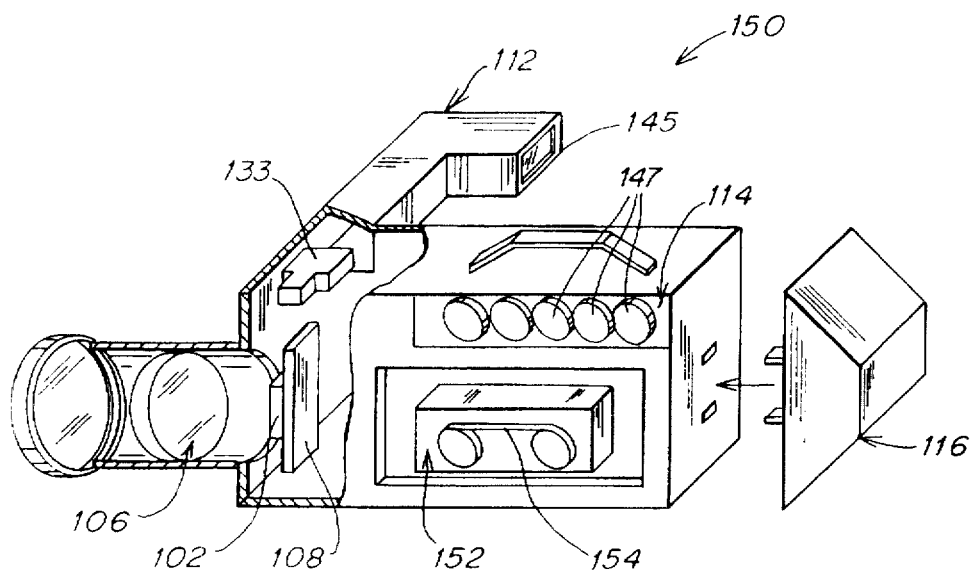
FIGS. 15a and 15b illustrate another embodiment of the imaging system of FIG. 10 which is a camera/recorder (camcorder), in particular
Figure 15B:
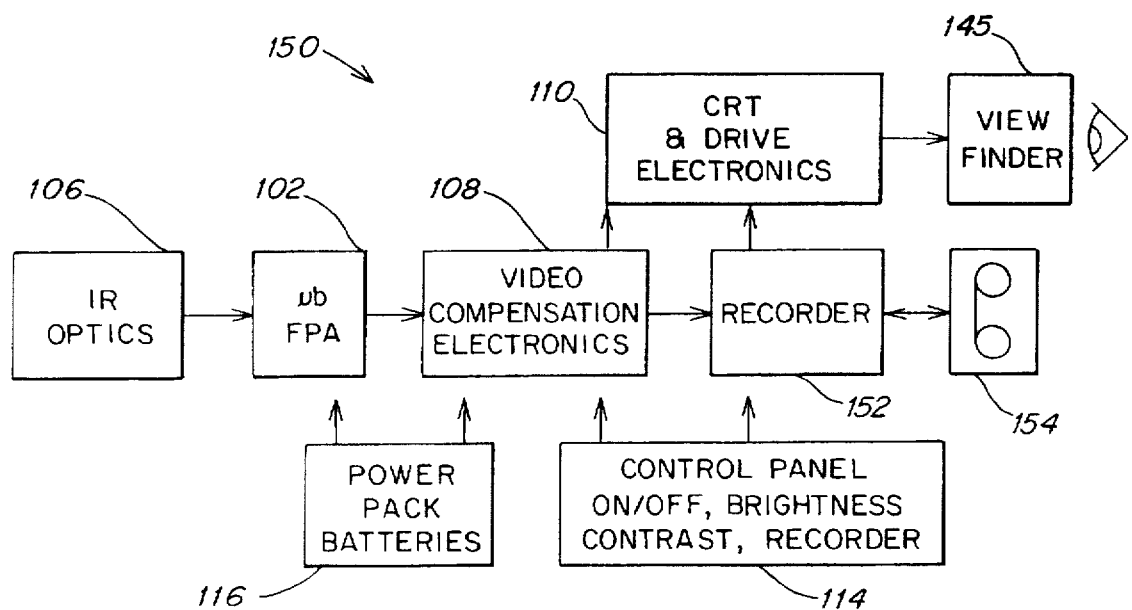

Still another imaging system that may use the focal plane array of the present invention is a miniature camera/recorder (hereinafter a "camcorder") such as is illustrated in FIGS. 15a–15b. FIG. 15a illustrates a cross-sectional view of the camcorder, and FIG. 15b is a block diagram of the camcorder. It is to be appreciated that parts similar to the imaging system of FIG. 10 are identified with similar reference numbers, and any description thereof is not repeated. The camcorder includes a recorder 152 for recording signals on a suitable recording medium 154. It is to be appreciated that the recording medium can be any recording medium known to one of ordinary skill in the art such as a magnetic recording tape of a VHS, 8 mm, or BETA format. In a preferred embodiment of the camcorder, the display 112 includes a view finder 145 as well as a CRT or FPD 133. In addition, in the preferred embodiment the supply electronics 116 is a rechargeable battery pack, and the controller 114 includes control knobs 147 and electronics for rewinding, fast forwarding, and playing back the recording medium. Further, in the preferred embodiment the focal plane array is used in at least one IR wavelength band of interest to provide a long-range camcorder that can be used at night, in the daytime, to penetrate smoke or inclement weather, and the like. In addition, the camcorder of FIG. 15 is a self-contained unit having a reduced size, weight and power consumption and also having an increased reliability and sensitivity.

Figure 16A:
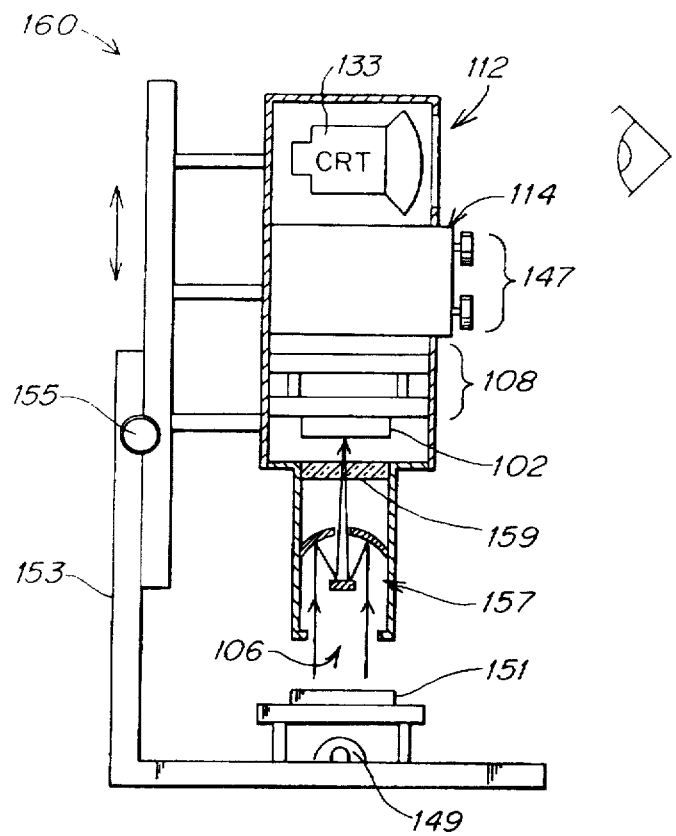
FIGS. 16a and 16b illustrate another embodiment of the imaging system of FIG. 10 which is a microscope, in particular
Figure 16B:
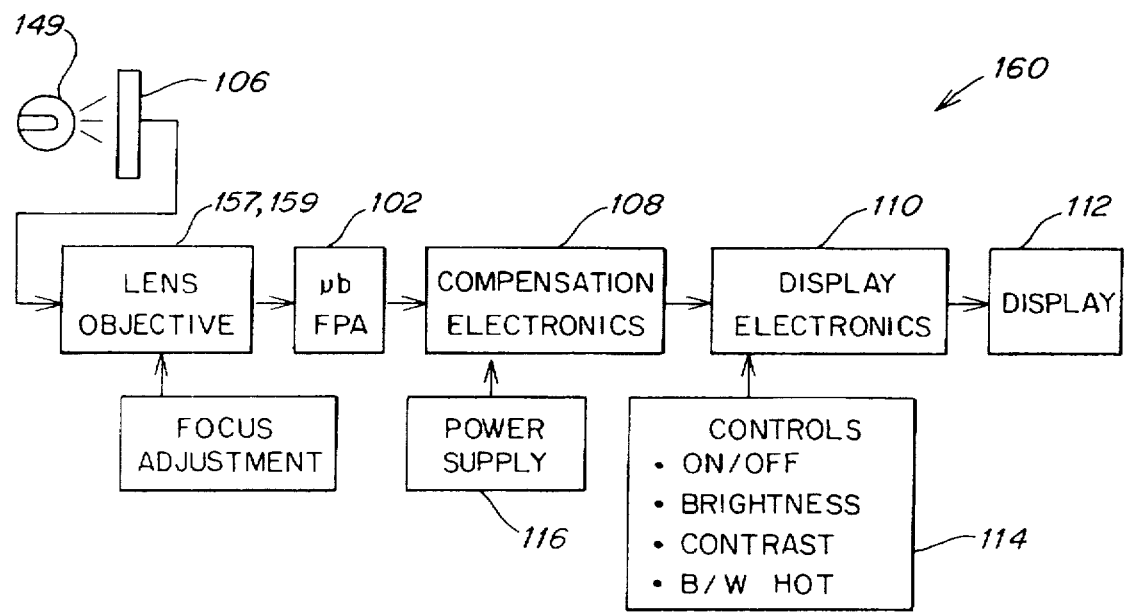

Yet another embodiment of an imaging system that may use the focal plane array of the present invention is a microscope 160 such as is illustrated in FIGS. 16a–16b. FIG. 16a illustrates a side elevational view of the microscope and FIG. 16b illustrates an operational block diagram of the microscope. It is to be appreciated that parts similar to the imaging system of FIG. 10 are identified with similar reference numbers and that any description thereof is not repeated. The microscope includes a microscope base 153 having a position adjuster 155, and a specimen or integrated circuit mask 151 which is backlit by a light source 149, as is known to those of skill in the art. In a preferred embodiment of the microscope of FIGS. 16a–16b, the display 112 includes a CRT or FPD 133, the controller 114 includes manual control knobs 147 and the optics 106 includes a front surface mirror 157. In addition, the preferred embodiment can be used over a plurality of IR wavelength bands of interest, for example, from 3–5 μm, from 8–12 μm, or in the visible range of wavelengths with the aid of filter 159 to provide multi-spectral images with the microscope.

Figure 17A:
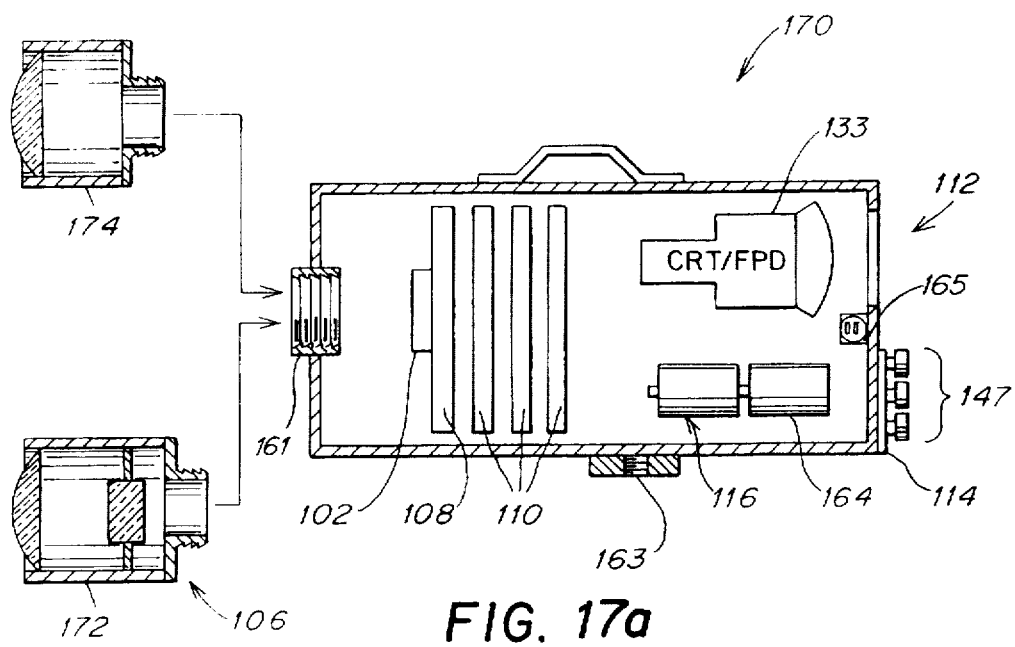
FIGS. 17a and 17b illustrate another embodiment of the imaging system of FIG. 10 which is a radiometer/spectrometer system, in particular
Figure 17B:
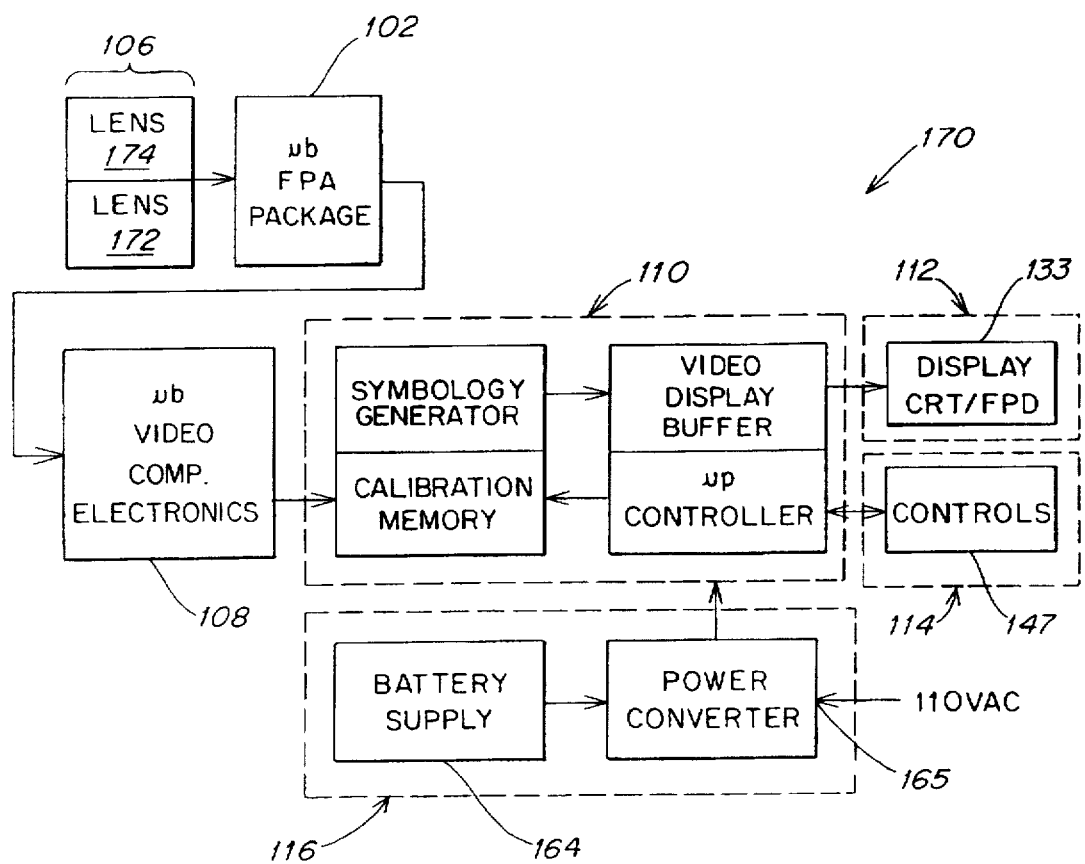

Still, another imaging system that may use the focal plane array of the present invention is the imaging radiometer/spectrometer such as is illustrated in FIGS. 17a–17b. FIG. 17a illustrates a cross-sectional view of the imaging radiometer/spectrometer 170, and FIG. 17b illustrates a block diagram of the imaging radiometer/spectrometer. It is to be appreciated that parts similar to the imaging system of FIG. 10 are identified with similar reference numbers and any description thereof is not repeated. In the imaging radiometer/spectrometer, the lens 106 can be either one of a spectral-splitting lens 172, which is used to provide a spectrometer, and an imaging lens 174 that is used to provide the radiometer. The imaging radiometer is used to measure a temperature of a scene on which the radiometer is focussed, and the spectrometer is used to measure an energy or power emitted by the scene as a function of the wavelength at which the scene is emitting the electromagnetic signal.

The radiometer/spectrometer also includes a lens mount 161 for mounting either of the spectral-splitting lens 172 and the imaging lens 174, and a tripod mount 164 for mounting the radiometer/spectrometer to a tripod. In the preferred embodiment of the radiometer/spectrometer, the display 112 includes a CRT or FPD, the controller 114 includes manual control knobs 147, and the supply electronics includes rechargeable batteries 163 as well as a 110 volt AC connector 165. In addition, the focal plane array is used in at least one IR wavelength band of interest to provide a long-range radiometer/spectrometer that can be used at night, in the daytime without washout, to penetrate smoke, and to penetrate inclement weather. Further, the radiometer/spectrometer is a self-contained unit having a reduced size, weight and power consumption while also having an increased reliability and sensitivity.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A microbridge detector, comprising:
    a semiconductor substrate;
    a microbridge disposed above the semiconductor substrate, the microbridge including an active area that is smaller than a pixel collection area of the microbridge detector;
    downwardly extending leg portions which are a continuation of the microbridge and which support the microbridge above the semiconductor substrate so that a thermal isolation gap exists between the microbridge and the semiconductor substrate; and
    electrically conductive paths included within said downwardly extending leg portions connecting the active area to the semiconductor substrate.

2. The microbridge detector of claim 1, wherein the active area is patterned with alternating absorption regions and transmissive windows.

3. The microbridge detector of claim 2, wherein the alternating absorption regions include a layer of absorptive material.

4. The microbridge detector of claim 2, wherein the alternating absorption regions include a thin film layer of temperature responsive resistive material.

5. The microbridge detector of claim 2, wherein the active area is patterned with alternating linear absorption regions and alternating linear transmission windows.

6. The microbridge detector of claim 2, wherein the active area is patterned with rows and columns of absorptive elements dispersed with transmissive windows to form a grid structure, and wherein each row and column of absorptive elements has at least one of a temperature resistive material and an absorptive material.

7. The microbridge detector of claim 1, wherein the active area is a substantially rectangular area located substantially at a center of the microbridge, wherein the electrically conductive paths include first and second electrically conductive paths respectively connected to a first end and a second end of the active area which are spirally wound around the active area, wherein the first and second electrically conductive paths act as antennas to absorb incident radiation and to couple the incident radiation to the active area, and wherein the first and second electrically conductive paths also couple a signal indicating a change in temperature of the active area in response to the incident radiation to the semiconductor substrate.

8. The microbridge detector of claim 1, further comprising a concentrator, disposed between the microbridge and the semiconductor substrate, that reflects incident radiation towards the active area to enhance an absorption efficiency of the detector.

9. The microbridge detector of claim 8, wherein the concentrator is substantially a truncated horn antenna that acts to concentrate the incident radiation transmitted through the microbridge towards the active region so as to create the optical collection area greater than the active area of the detector.

10. The microbridge detector of claim 1, wherein the active area has a length on a side in range of a half of a wavelength and a pixel collecting area in a range of 1 to 2 wavelengths of an operating range of wavelengths of the microbridge detector.

11. The microbridge detector of claim 1, wherein the electrically conductive paths have a length such that a thermal time constant of the microbridge detector is substantially the same as that of a microbridge detector having an active area substantially equal to the pixel correction area of the microbridge detector.

12. A microbridge detector, comprising:

a semiconductor substrate;

a microbridge disposed above the semiconductor substrate, the microbridge including an active area of the microbridge detector;

downwardly extending leg portions which are a continuation of the microbridge and which support the microbridge above the semiconductor substrate so that a thermal isolation gap exists between the microbridge and the semiconductor substrate;

electrically conductive paths included within said downwardly extending leg portions connecting the active area to the semiconductor substrate; and means for collecting incident radiation with the microbridge detector over a pixel collection area that is greater than the active area of the microbridge detector.

13. The microbridge detector of claim 12, wherein the means for collecting includes the active area which is patterned with alternating absorption regions and alternating transmissive windows.

14. The microbridge detector of claim 13, wherein the alternating absorption regions include a layer of temperature responsive resistive material.

15. The microbridge detector of claim 13, wherein the alternating absorption regions include a layer of absorbing material.

16. The microbridge detector of claim 13, wherein the active area is patterned with alternating linear absorption regions and alternating linear transmission windows.

17. The microbridge detector of claim 13, wherein the active area is patterned with rows and columns of absorptive elements dispersed with transmissive windows to form a grid structure, and wherein each row and column of absorptive elements has at least one of a temperature resistive material and an absorptive material.

18. The microbridge detector of claim 12, wherein the active area is a substantially rectangular patch located at substantially a center of the microbridge, and wherein the means for collecting includes first and second electrically conductive paths connected to a first end and a second end of the active area and which are wound spirally around the active area, wherein the first and second electrically conductive paths act as antennas to absorb incident radiation and to couple the incident radiation to the active area, and wherein the first and second electrically conductive paths also couple a sensed signal indicating a change in temperature of the active area, in response to the incident radiation, to the semiconductor substrate.

19. The microbridge detector of claim 12, wherein the means for collecting includes a concentrator disposed between the microbridge and the semiconductor substrate, that reflects incident radiation towards the active area to enhance an absorption sensitivity of the microbridge detector.

20. The microbridge detector of claim 19, wherein the concentrator is substantially a truncated horn antenna that acts to concentrate the incident radiation transmitted through the microbridge towards the active region.

21. The microbridge detector of claim 12, wherein the active area has a length on a side in range of a half of a wavelength and a pixel collecting area in a range of 1 to 2 wavelengths of an operating range of wavelengths of the microbridge detector.

22. The microbridge detector of claim 12, further comprising a means for creating a thermal time constant of the microbridge detector which is substantially the same as that of a microbridge detector having an active area substantially the same size as the pixel collection of the microbridge detector.

23. A microbridge detector, comprising:

a semiconductor substrate;

a microbridge disposed above the semiconductor substrate, the microbridge including an active area that is patterned with alternating absorption regions and transmissive windows to create an active area that is smaller than a pixel collection area of the microbridge detector;

downwardly extending leg portions which are a continuation of the microbridge and which support the microbridge above the semiconductor substrate so that a thermal isolation gap exists between the microbridge and the semiconductor substrate; and electrically conductive paths included within the downwardly extending leg portions connecting the active area to the semiconductor substrate.

24. A microbridge detector, comprising:

a semiconductor substrate;

a microbridge disposed above the semiconductor substrate, the microbridge including an active area that is substantially rectangular and located substantially at a center of the microbridge;

downwardly extending leg portions which are a continuation of the microbridge and which support the microbridge above the semiconductor substrate so that a thermal isolation gap exists between the microbridge and the semiconductor substrate; and electrically conductive paths included within the downwardly extending leg portions including first and second electrically conductive paths connected to a first end and a second end of the active area and which are spirally wound around the active area, the first and second electrically conductive paths configured so as to act as antennas to absorb incident radiation and to couple the incident radiation to the active area so as to create a pixel collection area greater than the active area, the first and second electrically conductive paths coupling a signal indicating a change in temperature of the active area to the semiconductor substrate in response to the incident radiation.

25. An imaging system, comprising:

an optical element that receives an electromagnetic signal, focusses the electromagnetic signal and outputs a focussed signal;

a focal plane array including a plurality of detector devices disposed in the array, wherein each detector device detects the focussed signal, converts the focussed signal into a sensed signal and outputs the sensed signal to provide a plurality of sensed signals at an output of the focal plane array, and wherein each detector device includes an active area that is smaller than a pixel collection area of the detector device;

a focal plane array processor that receives the plurality of sensed signals, processes the plurality of sensed signals to correct any gain and any offset errors between each of the plurality of sensed signals, and outputs a plurality of processed signals;

a display processor that receives the plurality of processed signals, converts the plurality of processed signals into a display signal suitable for output to a display, and that outputs the display signal; and a display that receives the display signal and displays the display signal so as to display an image of a scene or object that emitted the electromagnetic signal.

26. The imagining system of claim 25, wherein the imagining system is a spectrometer.

27. The imaging system of claim 25, wherein the imaging system is a helmet-mounted imaging system.

28. The imaging system of claim 25, wherein the imaging system is a goggle-mounted imaging system.

29. The imaging system of claim 25, wherein the imaging system is a monocular system.

30. The imagining system of claim 25, wherein the imaging system is a binocular system.

31. The imaging system of claim 25, wherein the imaging system is a weapon sight.

32. The imaging system of claim 25, wherein the imagining system is a camcorder apparatus.

33. The imagining system of claim 25, wherein the imagining system is a microscope.

34. The imagining system of claim 25, wherein the imagining system is a radiometer.

35. A microbridge detector, comprising:

a semiconductor substrate;

a microbridge disposed above the semiconductor substrate, including an active area;

a concentrator, disposed between the microbridge and the semiconductor substrate, that reflects incident radiation not initially absorbed by the active area towards the active area to create a pixel collection area of the microbridge detector that is greater than the active area;

downwardly extending leg portions which are a continuation of the microbridge and which support the microbridge above the semiconductor substrate so that a thermal isolation gap exists between the microbridge and the semiconductor substrate; and electrically conductive paths included within said downwardly extending leg portions connecting the active area to the semiconductor substrate.

36. The microbridge detector of one of claims 24 and 35, wherein the electrically conductive paths have a length such that a thermal time constant of the microbridoe detector is substantially the same as that of a microbridge detector having an active area substantially equal to the pixel correction area of the microbridge detector.

* * * * *